United States Patent [19]
Oguri

[11] Patent Number: 5,457,413
[45] Date of Patent: Oct. 10, 1995

[54] BIMIS LOGIC CIRCUIT

[75] Inventor: Takashi Oguri, Tokyo, Japan

[73] Assignee: NEC Corporation, Tokyo, Japan

[21] Appl. No.: 130,661

[22] Filed: Oct. 1, 1993

[30] Foreign Application Priority Data

Oct. 1, 1992 [JP] Japan ................................ 4-263350

[51] Int. Cl.⁶ .................................................. H03K 19/02
[52] U.S. Cl. ........................................ 326/109; 326/110
[58] Field of Search .................................. 307/446, 570, 307/451, 443

[56] References Cited

U.S. PATENT DOCUMENTS

| | | | |
|---|---|---|---|
| 4,804,869 | 2/1989 | Masuda | 307/446 |
| 4,977,337 | 12/1990 | Ohbayashi | 307/446 |
| 5,001,366 | 3/1991 | Masuda | 307/570 |
| 5,164,617 | 11/1992 | Hanibuchi | 307/446 |
| 5,206,546 | 4/1993 | Usami | 307/446 |
| 5,313,116 | 5/1994 | Murabayashi | 307/446 |

Primary Examiner—Edward P. Westin
Assistant Examiner—Andrew Sanders

[57] ABSTRACT

A BiMIS circuit has first and second input terminals; first and second output terminals; a first bipolar transistor having a collector receiving a first potential, an emitter connected to the first output terminal, and a base connected to the second output terminal; a second bipolar transistor having a collector connected to the first output terminal and an emitter receiving a reference potential; a first MIS transistor circuit including MIS transistors, connected to the base and the collector of the first bipolar transistor and the first input terminal, and turned on or off depending on a potential of the first input terminal; and a second MIS transistor circuit including MIS transistors, connected to the base of the first bipolar transistor, the second input terminal and the base of the second bipolar transistor, and turned on or off depending on a potential of the second input terminal. The BiMIS circuit includes at least one of: a capacitor having one terminal connected to the first input terminal and the other terminal connected to the base of the second bipolar transistor; a discharging circuit connected to the base of the first bipolar transistor for discharging the base; and a potential setting circuit connected to the base of the second bipolar transistor for setting a potential of the base at a predetermined level.

15 Claims, 20 Drawing Sheets

BIMIS LOGIC CIRCUIT

BACKGROUND OF THE INVENTION

1. Field of the Invention

The present invention relates to a BiMIS (Bi-MIS) logic circuit in which bipolar transistors and MIS transistors are combined, and more particularly to a BiCMIS (Bi-CMIS-:complementary MIS) static logic circuit, a dynamic logic circuit, and a semiconductor integrated circuit adapted for a super high-speed operation at a low-power supply potential or voltage.

2. Prior Art

A so-called BiCMIS logic circuit using bipolar transistors and CMIS transistors is described in U.S. Pat. Nos. 4,558, 234, 4,616,146, 4,638,186, 4,769,561 and others and has been known. The contents of these patents are incorporated in this specification by a reference.

FIG. 27 shows the BiCMIS logic circuit disclosed in U.S. Pat No. 4,769,561 described above. This circuit has an advantage of a low-input-capacitance and high-output driving capability and capable of operating at high speed with low-power dissipation. For this reason, the circuit is used in LSIs requiring a high performance and memories. The circuit can achieve the above-described advantage when the power supply potential or voltage is about 5 V but cannot be operated at high speed when the power supply potential is about 3 V. The deterioration of the high-speed operability with the reduced power supply potential is due to the remarkable increase of delay of a negative-going output signal 2720 with respect to a positive-going input signal 2710, as shown in FIG. 28. FIG. 29 shows a power supply potential dependency of the delay time of the negative-going output signal. In FIG. 29, the solid line and the broken line indicate the power supply dependency of the inverter delay time with respect to the CMIS logic circuit and the BiCMIS logic circuit, respectively. As is apparent from FIG. 29, the BiCMIS logic circuit shown in FIG. 27 has lost its availability as a high-speed logic when the power supply potential is about 4.0 V or less.

The main reason of the deterioration of the high speed operation is as follows. When the power supply potential is reduced, a source-drain potential Vds of an N-channel MIS transistor (hereinafter referred to as NMIS) 2705 is also reduced since a base-emitter potential Vbe of a bipolar transistor (hereinafter referred to as BJT) is constant. For this reason, a base current of the BJT 2702 is abruptly reduced.

FIG. 30 shows a circuit disclosed in U.S. Pat. No. 4,558,234. In this circuit, BJT 3001 and NMIS 3002 are used for a pull-up and a pull-down of the output, respectively. This circuit uses the NMIS as the pull-down transistor and therefore does not exhibit the abrupt deterioration of the speed even in the neighborhood of 3 V of the power supply potential. However, the use of the NMIS as the pull-down transistor will increase the delay of the negative-going output signal when driving a load having a large capacitance. The increase of the conductance of the NMIS for improving the driving capability will increase the gate capacitance of the NMIS and deteriorate the speed of the circuit in the upstream. Further, there is a signal-delay due to drain-junction capacitance.

The reduction of the power supply potential for the LSIs is not avoidable from a view point of solving problems of reduced potential-resistivity of a refined semiconductor device and increased power dissipation due to high integration. For this reason, the BiCMIS logic circuit which can exhibit a high performance as in the prior art even with the low power supply potential has been desired.

However, according to the conventional BiCMIS described above, the reduction of the power supply potential in the neighborhood of 3 V will abruptly deteriorate the switching speed. For this reason, the conventional BiCMIS cannot be used as the high-speed logic circuit in the next generation.

SUMMARY OF THE INVENTION

An object of the present invention is to provide a BiMIS logic circuit and a semiconductor integrated circuit which can retain the high-speed operation even with the low power supply potential.

In order to achieve the above object, according to a first aspect of the present invention, a BiMIS circuit comprises: at least one first input terminal (110) and at least one second input terminal (120); a first output terminal (130, 150); a first bipolar transistor (101) a collector of which receives a first potential or voltage and an emitter of which is connected to the first output terminal (130); a second bipolar transistor (102) a collector of which is connected to the output terminal and an emitter of which receives a reference potential; a first MIS transistor circuit (103) constituted by at least one MIS transistor, connected to a base and the collector of the first bipolar transistor and the first input terminal, and turned on and off in response to a potential supplied to the first input terminal; a second MIS transistor circuit (104) constituted by at least one MIS transistor, connected to the base of the first bipolar transistor, the second input terminal and a base of the second bipolar transistor, and turned on or off in response to a potential supplied to the second input terminal; and a first capacitor one terminal of which is connected to the first input terminal and the other terminal of which is connected to the base of the second bipolar transistor.

According to a second aspect of the present invention, a BiMIS logic circuit comprises: first and second input terminals (510, 520); a first output terminal (530, 550); a first bipolar transistor (501) a collector of which receives a first potential and an emitter of which is connected to the first output terminal (530); a second bipolar transistor (502) a collector of which is connected to the output terminal and an emitter of which receives a reference potential; a first MIS transistor circuit (503) constituted by at least one MIS transistor, connected to the first input terminal and a base and the collector of the first bipolar transistor, and turned on or off in response to a potential supplied to the first input terminal; a second MIS transistor circuit (504) constituted by at least one MIS transistor, connected to the base of the first bipolar transistor, the second input terminal and a base of the second bipolar transistor, and turned on or off in response to a potential supplied to the second input terminal; and discharging means (505) connected to the base of the first bipolar transistor for discharging the base.

According to a third aspect of the present invention, a BiMIS circuit comprises: first and second input terminals (910, 920); a first output terminal (930, 950); a first bipolar transistor (901) a collector of which receives a first potential and an emitter of which is connected to the first output terminal (930); a second bipolar transistor (902) a collector of which is connected to the output terminal and an emitter of which receives a reference potential; a first MIS transistor circuit (103) constituted by at least one MIS transistor, connected to the first input terminal and the collector and a base of the first bipolar transistor, and turned on or off depending on a potential supplied to the first input terminal; a second MIS transistor circuit (104) constituted by at least one MIS transistor, connected to the base of the first bipolar transistor, the second input terminal and a base of the second bipolar transistor, and turned on or off depending on a potential supplied to the second input terminal; and potential setting means (905) connected to the base of the second bipolar transistor for setting a potential of the base at a predetermined level.

The BiMIS logic circuit may be provided with a second output terminal (950) connected to the base of the first bipolar transistor.

When a plurality of BiMIS logic circuits are connected, the first output terminal of the BiMIS logic circuit in the upstream may be connected to the first input terminal of the BiMIS logic circuit in the downstream and the second output terminal of the BiMIS logic circuit in the upstream may be connected to the second input terminal of the BiMIS logic circuit in the downstream.

The first MIS transistor circuit may be constituted, for example, by an MIS transistor (903) a drain of which is connected to the base of the first bipolar transistor, a gate of which is connected to the first input terminal and a source of which receives the first potential.

The second MIS transistor circuit may constituted by, for example, an MIS transistor (904) a drain of which is connected to the base of the first bipolar transistor, a gate of which is connected to the second input terminal and a source of which is connected to the base of the second bipolar transistor.

One of the first and the second MIS transistor circuits may be a circuit (1403) which is turned on when all the input signals are at a low level, for example, to electrically connect the collector with the base of the first bipolar transistor, and the other is a circuit which is turned on when at least one of the input signals is at a high level, for example, to electrically connect the base of the first bipolar transistor with the base of the second bipolar transistor.

One of the first MIS transistor circuit and the second MIS transistor circuits may be constituted by a plurality of MIS transistors (1503, 1504) current paths of which are connected in series, for example, and the other is constituted by a plurality of MIS transistors (1506, 1505) current paths of which are connected in parallel.

DETAILED DESCRIPTION OF THE PREFERRED EMBODIMENTS

An embodiment of the present invention will now be described.

Figure 1:
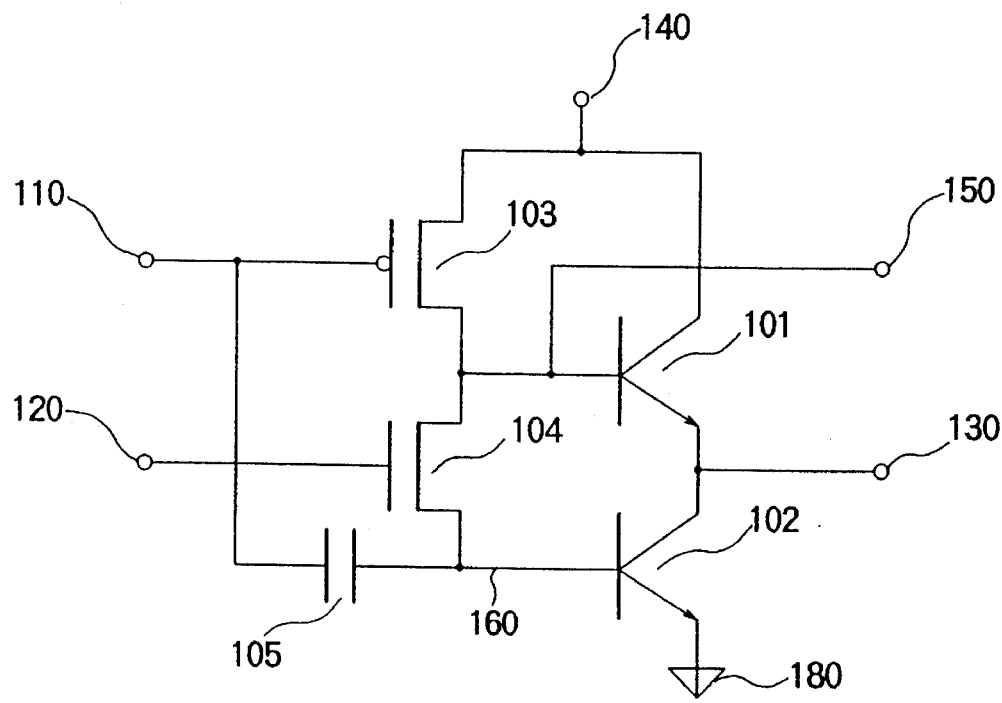
FIG. 1 is a circuit diagram of a BiMIS circuit according to a first embodiment of the present invention.

FIG. 1 is a circuit diagram showing a first embodiment of the present invention.

In FIG. 1, a first BJT 101 has a collector connected to a power supply terminal 140 to which a power supply potential is applied and an emitter connected to a first output terminal 130. A second BJT 102 has a collector connected to the first output terminal 130 and an emitter connected to a terminal 180 to which a reference potential is applied. A P-channel MIS transistor (hereinafter referred to as PMIS) 103 has a drain connected to a base of the first BJT 101, a gate connected to a first input terminal 110 to which a first input signal is supplied, and a source connected to the power supply terminal 140. An NMIS 104 has a drain connected to the first BJT 101, a gate connected to a second input terminal 120 to which a second input signal is applied, and a source connected a base of the second BJT 102. A capacitor 105 has one terminal connected to the first input terminal 110 and the other terminal connected to the base of the second BJT 102. The drain of the PMIS 103 is connected to a second output terminal 150, and the base of the BJT 102 serves as a node 160.

An operation of the above embodiment will now be described. Assume now that a threshold potential, or voltage of the PMIS, a threshold potential of NMIS, and a turn-on potential of the BJT are Vtp, Vtn, and Vf, respectively.

Figure 2:
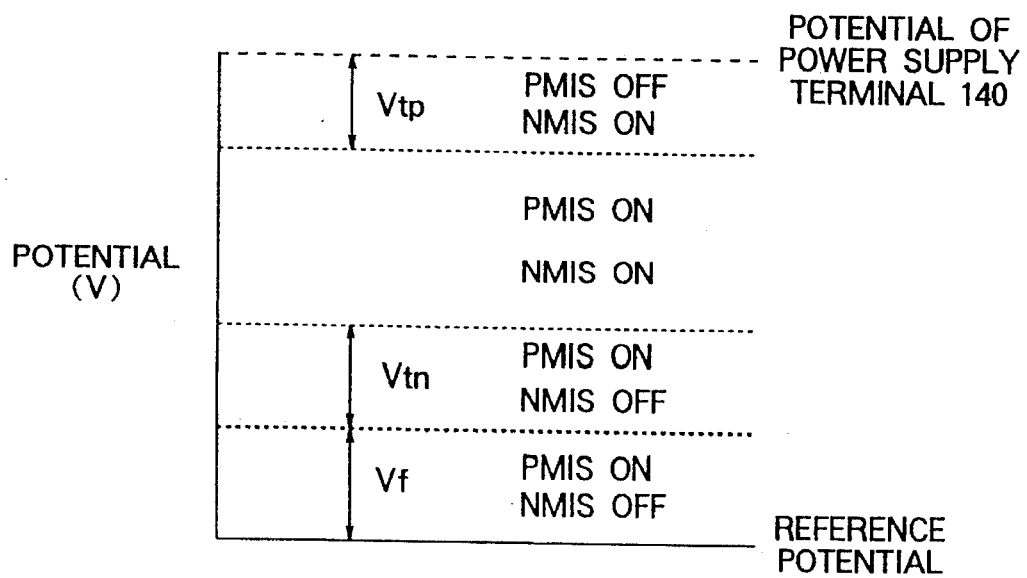
FIG. 2 is a view showing potential levels for turning on and off transistors constituting the circuit shown in FIG. 1.

FIG. 2 illustrate ON/OFF conditions of the PMIS 103 and the NMIS 104. The PMIS 103 is turned on when a potential or voltage of the first input signal applied to the first input terminal 110 takes a value of "power supply potential–Vtp" or less. Further, the NMIS 104 is turned on when a potential of the second input signal applied to the second input terminal 120 takes a value of "a reference potential+Vf of the second BJT 102+Vtn of the NMIS 104" or more.

A circuit operation will now be described assuming that the first and second input signals applied to the first and second input terminals 110 and 120 are identical with each other. When a signal having a potential (hereinafter referred to as a low potential) at which the PMIS 103 is turned on and the NMIS 104 is turned off, respectively is applied to the input terminals 110 and 120, an potential of the second output terminal 150 raises to a potential (hereinafter referred to as a second-output-high-level potential) applied to the power supply terminal 140. Further, since the NMIS 104 is turned off, the potential of the node 160 drops to the potential at which the second BJT 102 is turned off. Since the potential of the second output terminal 150 raises to the potential of the power supply terminal 140, the potential of the first output terminal 130 is "the potential of the power supply terminal 140–Vf" (hereinafter referred to as a first-output-high-level potential).

Figure 3:
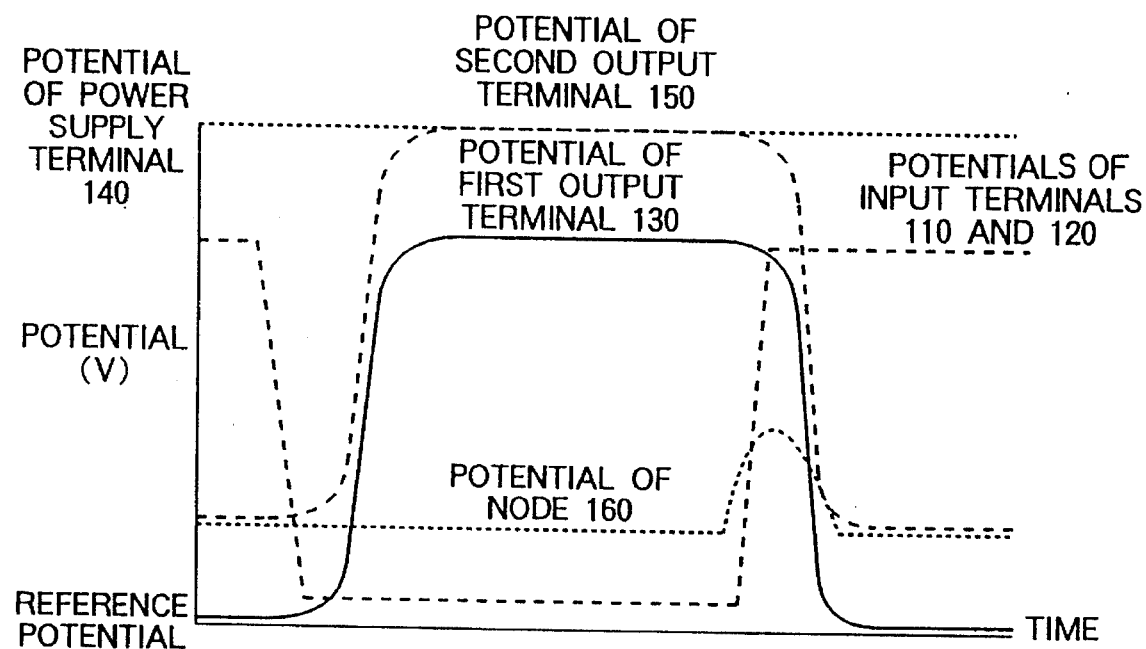
FIGS. 3 and 4 are timing charts indicating signals on the circuit in FIG. 1.

When a signal having a potential at which the NMIS 104 is turned on and the PMIS 103 is turned off is applied to the first and second input terminals 110 and 120, the second output terminal 150 and the node 160 are conducted. As a result, the potential of the second output terminal 150 is decreased and the potential of the node 160 is increased, resulting in identical potentials. The sizes of the PMIS, NMIS and BJT are adjusted so as to turn on the second BJT 102. When the second BJT is turned on, the potential of the first output terminal 130 is decreased. Since the PMIS 103 remains off, the supplement of the base current to the second BJT 102 is gradually decreased and finally, the second BJT 102 is turned off. The potential of the first output terminal 130 drops to the reference potential (hereinafter referred to as a first-output-low-level potential) by adjusting the base current of the second BJT 102 and the load current of the first output 130. Furthermore, the potential of the second output terminal 150 drops to the potential at which the second BJT 102 is turned off (hereinafter referred to as a second-output-low-level potential). The transition waveforms of the signals at this time is shown in FIG. 3.

Figure 4:
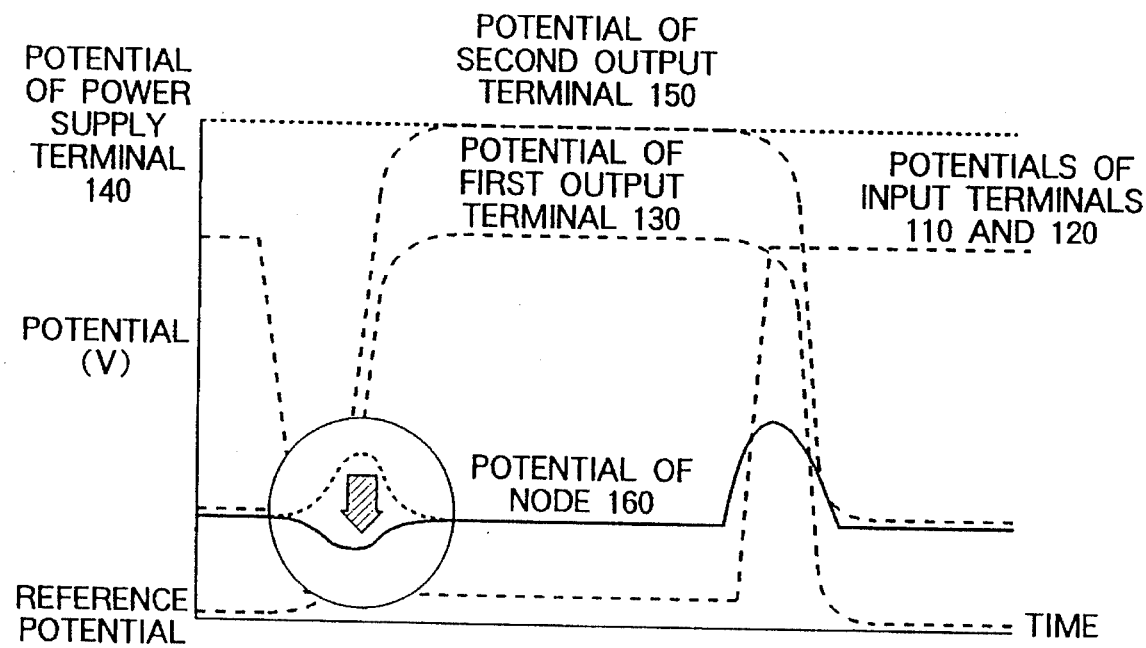

FIG. 4 illustrates waveforms showing an advantage of capacitor 105.

The capacitor 105 serves to constrain or suppress, at the leading edge of the potential of the first output terminal 130 and as shown by the solid line in the circle in FIG. 4, the increase of the potential of the node 160 as shown by the broken line in the circle in accordance with the increased potential of the input signal supplied to the input terminals 110 and 120. When the first output terminal 130 is at the low-level potential, the second BJT 102 is saturated. At this time, the redundant minor carriers are injected into the base of the second BJT. The capacitor 105 decreases a penetration-current or through-current of the second BJT 102 caused at the positive-going edge of the potential of the second output terminal 150. Furthermore, the capacitor 105 contributes to charge the node 160 at the negative-going edge of the potential of the first output terminal 130.

Figure 5:
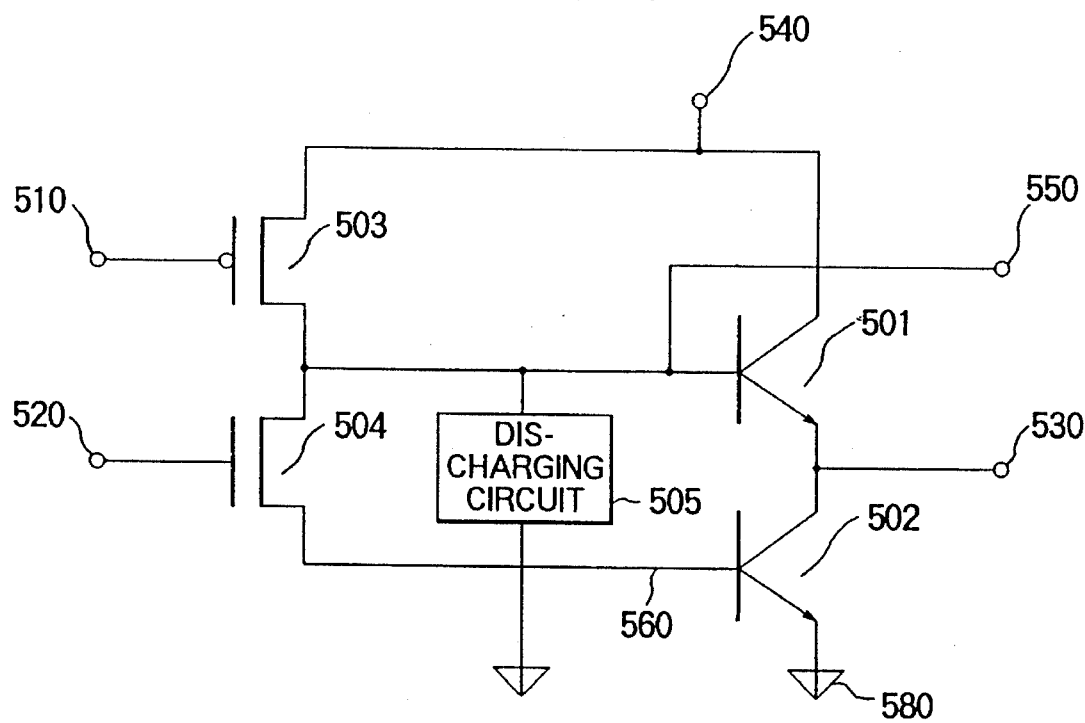
FIG. 5 is a circuit diagram of a BiMIS circuit according to a second embodiment of the present invention.

FIG. 5 shows a second embodiment of the present invention.

In this embodiment, a first BJT 501 has a collector connected to a power supply terminal 540 to which a power supply potential is applied, and an emitter connected to a first output terminal 530. A second BJT 502 has a collector connected to the first output terminal 530 and an emitter connected to a reference potential terminal 580 to which a reference potential is applied. A PMIS 503 has a drain connected to a base of the first BJT 501, a gate connected to a first input terminal 510 receiving a first input signal, and a source connected to the power supply terminal 540. An NMIS 504 has a drain connected to the base of the first BJT 501, a gate connected to a second input terminal 520 receiving a second input signal, and a source connected to a base of the second BJT 502.

A discharging circuit 505 has an input connected to the base of the first BJT 501 and an output connected to the reference potential.

The drain of the PMIS 503 is connected to a second output terminal 550 and the base of the BJT 502 serves as a node 560.

An operation of this embodiment is similar to that of the embodiment shown in FIG. 1.

Figure 6:
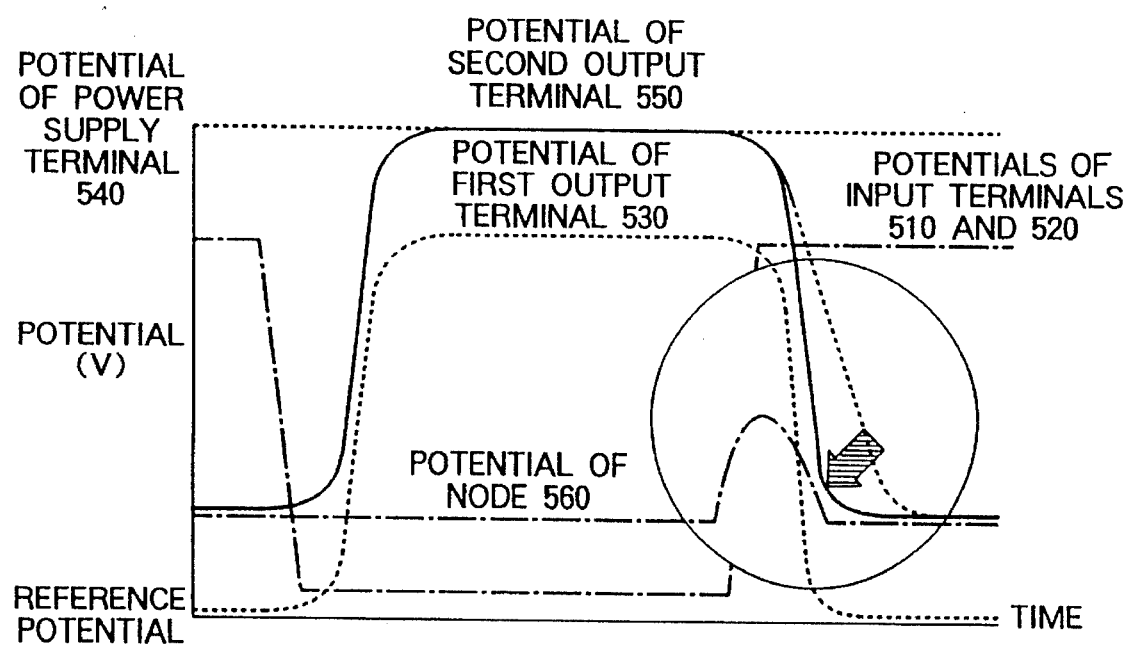
FIG. 6 is a timing chart for explaining an operation of the BiMIS circuit shown in FIG. 5.

FIG. 6 shows a timing chart showing an advantage of the discharging circuit 505. The discharging circuit 505 discharges the second output terminal 550 so as to decrease the penetrating current of the second BJT 502 at the negative-going edge of the potential of the first output terminal 530.

Third and fourth embodiments in which the embodiment shown in FIG. 5 is described in more detail.

Figure 7:
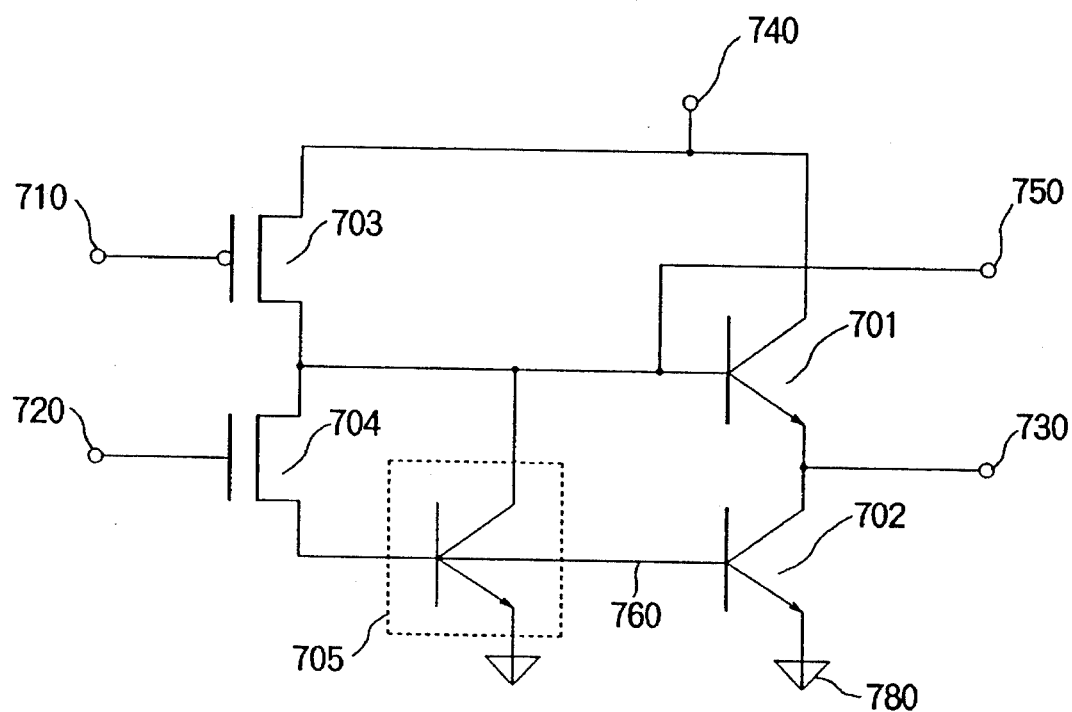
FIG. 7 is a circuit diagram of a BiMIS circuit according to a third embodiment in which the BiMIS circuit according to the second embodiment of the present invention is more specific.

FIG. 7 shows a third embodiment of the present invention. In FIG. 7, reference numerals 701 through 704 denote first and second BJTs, PMIS, and NMIS, respectively connected in a similar manner as shown in FIG. 5. A reference numeral 705 denotes a third BJT a collector, a base and an emitter of which are connected to bases of the first and second BJTs 701, 702, and a terminal 780 to which a reference potential is applied, respectively.

The base of the third BJT 705 is connected to a node 760.

For this reason, the third BJT 705 discharges the second output terminal 750 only in a transient state where first and second input signals applied to first and second input terminals 710 and 720 are changed to a high-level potential so that the PMIS 703 and the NMIS 704 turn off and on, respectively.

Figure 8:
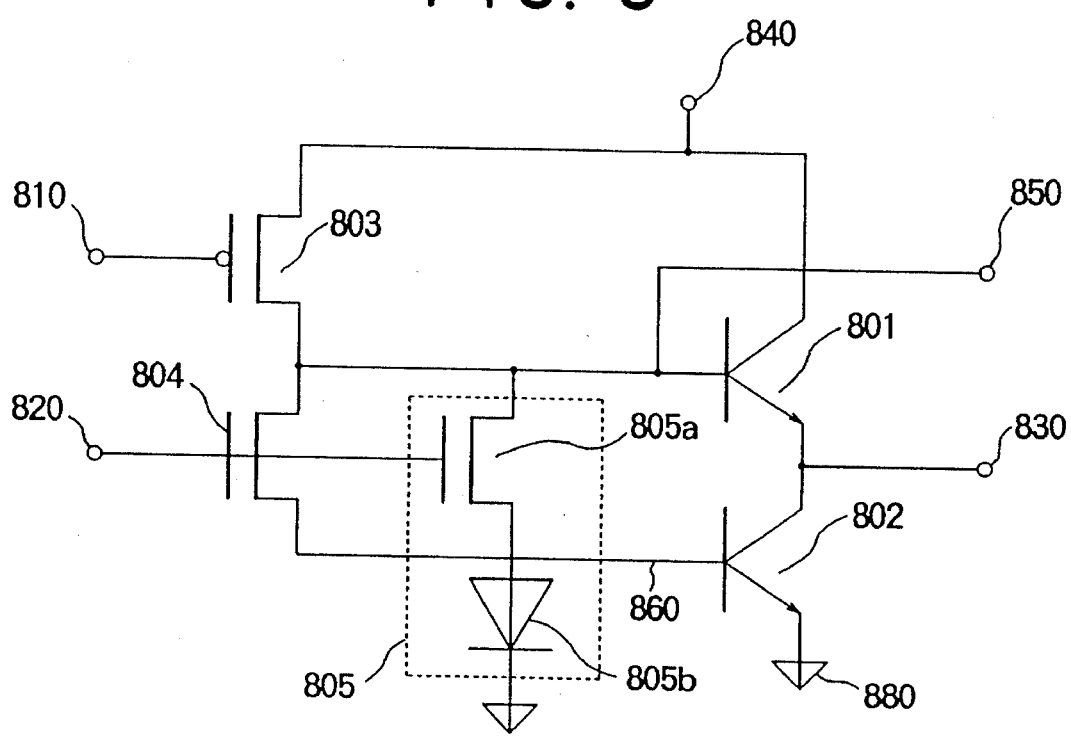
FIG. 8 is a circuit diagram showing a fourth embodiment in which the BiMIS circuit in the second embodiment of the present invention is more specific.

FIG. 8 shows a fourth embodiment of the present invention. In FIG. 8, reference numerals 801 through 804 denote first and second BJTs, the PMIS, and the NMIS, respectively connected in a similar manner as shown in FIG. 5. Reference numeral 805 denotes a discharging circuit including a second NMIS 805a and a diode 805b. The second NMIS 805a has a drain connected to a base of the first BJT 801, and a gate connected to a second input terminal 820. The diode 805b has an anode and a cathode connected to a source of the second NMIS 805a and a terminal 880 to which a reference potential is applied, respectively. For this reason, second NMIS 805a discharges the second output terminal 850 through the diode 805b only when the first and second input signals supplied to the terminals 810 and 820 are changed to the high level potential.

Figure 9:
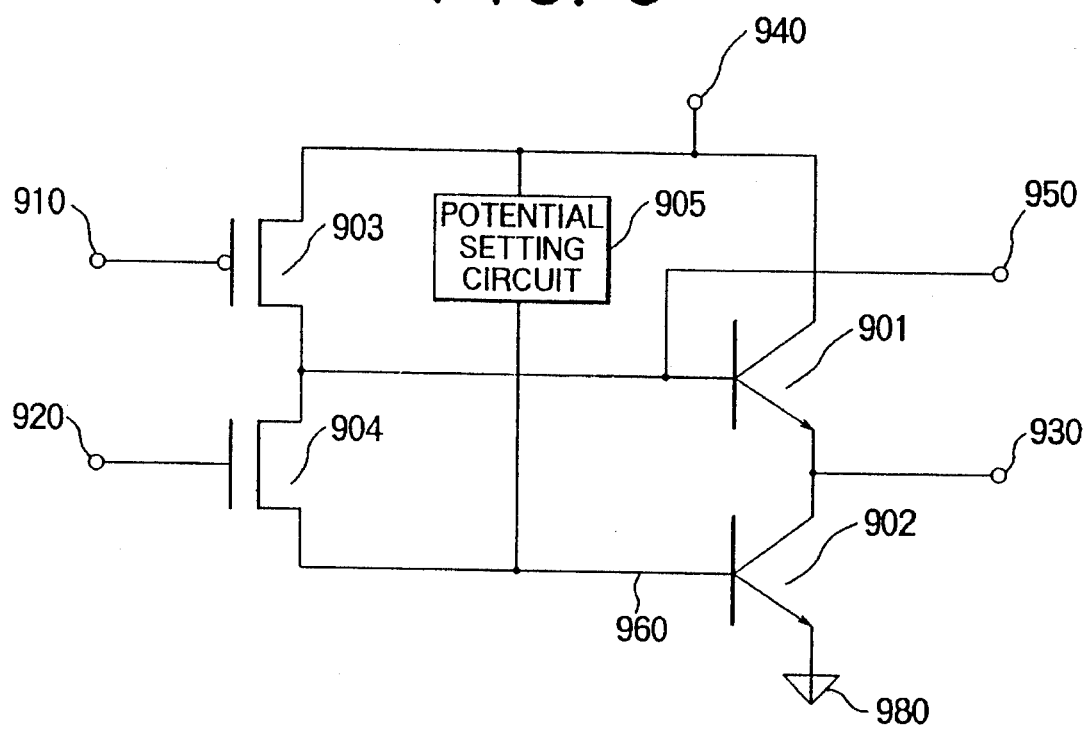
FIG. 9 is a circuit diagram of a BiMIS circuit according to a fifth embodiment of the present invention.

FIG. 9 shows a fifth embodiment of the present invention. In this embodiment, a first BJT 901 has a collector connected to a power supply terminal 940, and an emitter connected to a first output terminal 930. A second BJT 902 has a collector connected to the first output terminal 930 and an emitter connected to a terminal 980 to which a reference potential is applied. A PMIS 903 has a drain connected to a base of the first BJT 901, a gate connected to a first input terminal 910, and a source connected to the power supply terminal 940. An NMIS 904 has a drain connected to the base of the first BJT 901, a gate connected to a second input terminal 920, and a source connected to a base of the second BJT 902. A potential setting circuit 905 has an input connected to the power supply terminal 940 and an output connected to the base of the second BJT 902. The drain of the PMIS 903 is connected to the second output terminal 950 and the base of the BJT 902 serves as the node 960.

Figure 10:
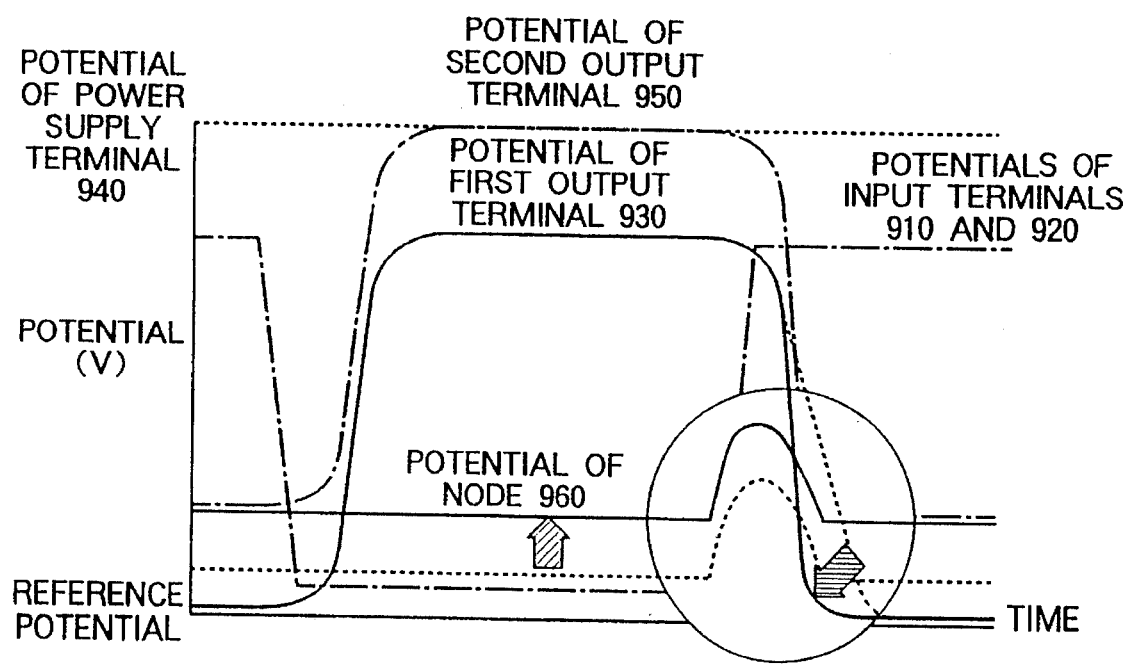
FIG. 10 is a timing chart for explaining an operation of the BiMIS circuit shown in FIG. 9.

An operation of this embodiment is basically same as that of the embodiment shown in FIG. 1. FIG. 10 illustrate an advantage due to the potential setting circuit 905. The potential setting circuit 905 sets the base potential of the second BJT 902 at about Vf, as shown in the portion surrounded by the circle in FIG. 10. The potential setting circuit 905 increases the base potential of the second BJT 902 so as to increase the discharging capability at the negative-going edge of the potential of the first output terminal 930.

Figure 11:
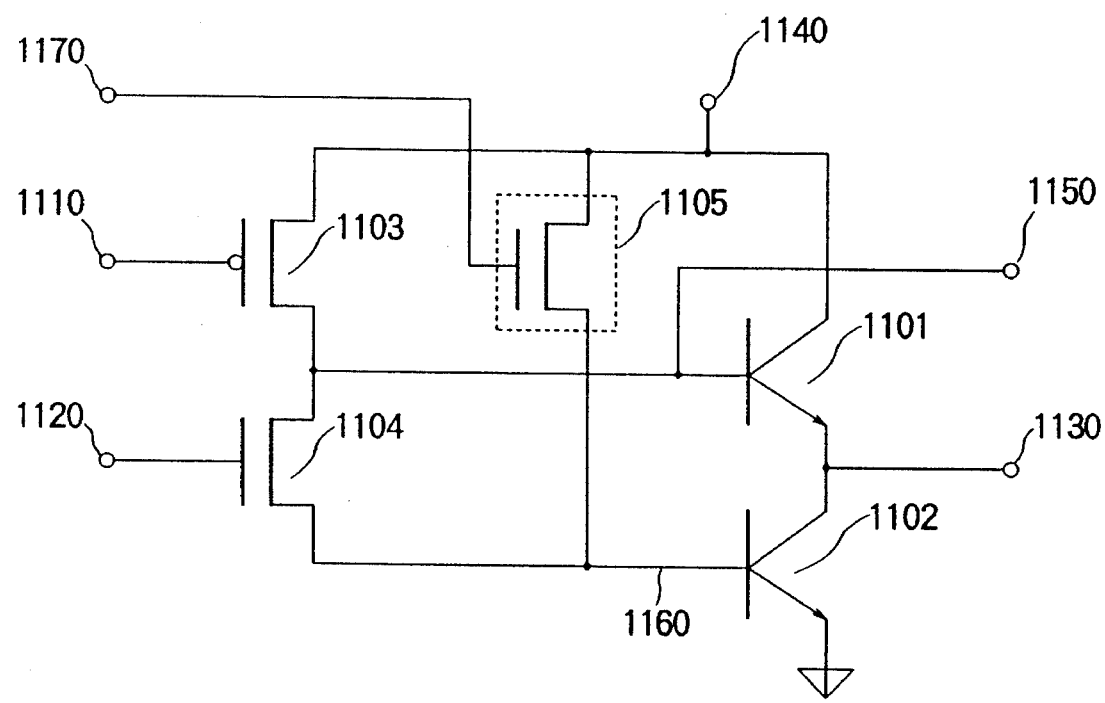
FIG. 11 is a circuit diagram showing a BiMIS circuit according to a sixth embodiment in which the BiMIS circuit in the fifth embodiment is more specific.

FIG. 11 shows a sixth embodiment where the embodiment shown in FIG. 9 is described in more detail. Reference numerals 1101 through 1104 denote first and second BJTs, a PMIS and an NMIS, respectively, connected same as shown in FIG. 9. A second NMIS 1105 has a drain connected to a base of the second BJT 1102, a gate connected to a terminal 1170 to which a reference potential is applied, and a source connected to a power supply terminal 1140. In this embodiment, the gate of the second NMIS 1105 is connected to the reference potential terminal 1170. For this reason, the second NMIS 1105 can set the base potential of the second BJT 1102 in the neighborhood of Vf so as to achieve the high-speed discharge operation of the first output terminal 1130.

Figure 12:
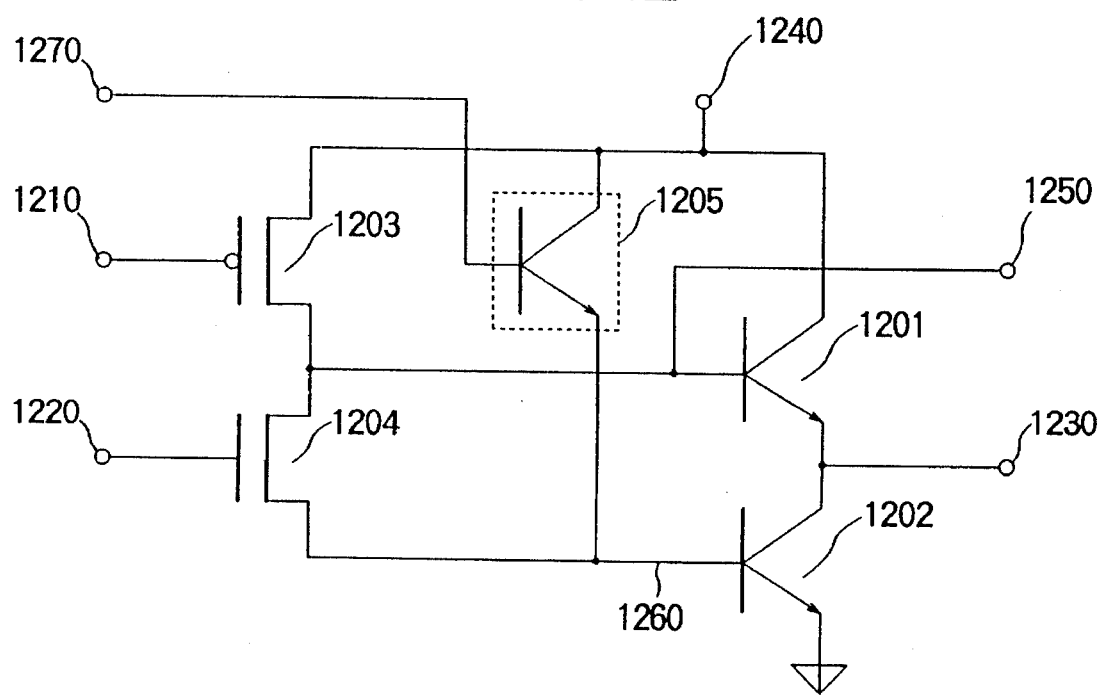
FIG. 12 is a circuit diagram showing a BiMIS circuit according to a seventh embodiment in which the BiMIS circuit shown in the fifth embodiment is more specific.

FIG. 12 shows a seventh embodiment of the present invention. In FIG. 12, reference numerals 1201 through 1204 denote first and second BJTs, a PMIS, and an NMIS, respectively, connected in a similar manner as shown in FIG. 9. A third BJT 1205 has a collector connected to a power supply terminal 1240, a base connected to a terminal to which a reference potential is applied, and an emitter connected to a base of the second BJT 1202. In this embodiment, the base of the third BJT 1205 is connected to the reference potential terminal 1270. For this reason, the base potential of the second BJT 1202 can be set in the neighborhood of Vf, resulting in a high-speed discharge operation of the first output terminal 1230.

Figure 13:
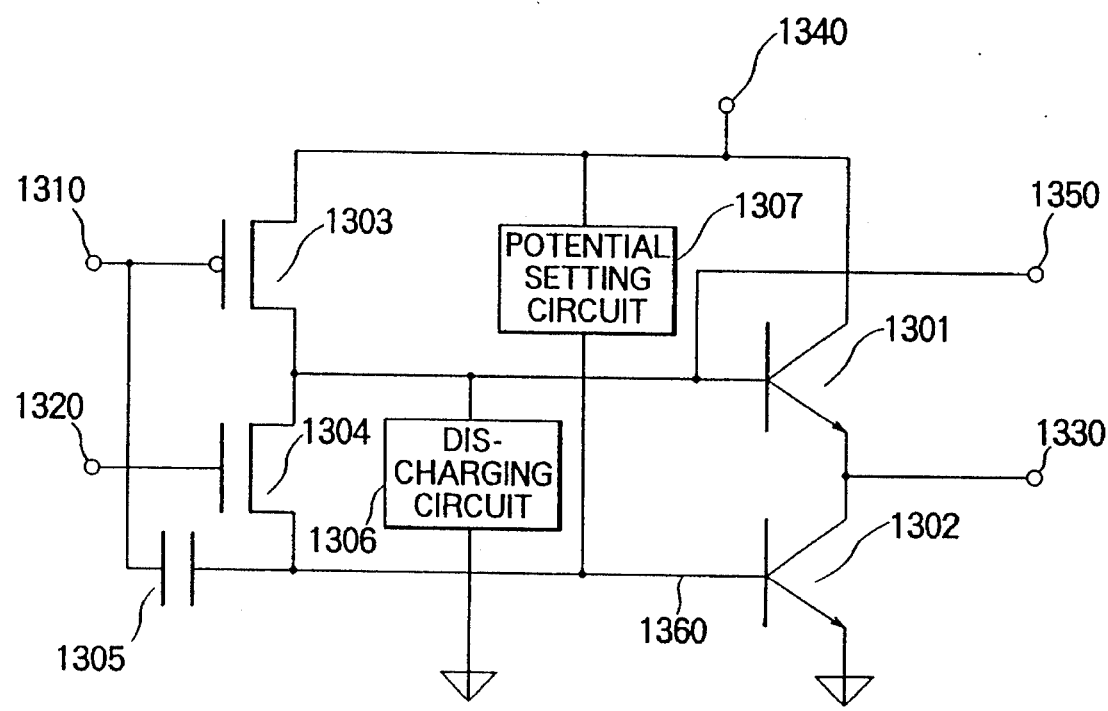
FIG. 13 is a circuit diagram showing a BiMIS circuit according to an eighth embodiment of the present invention.

FIG. 13 shows an eighth embodiment of the present invention. In this embodiment, a first BJT 1301 has a collector and an emitter connected to a power supply terminal 1340 and a first output terminal 1330, respectively. A second BJT 1302 has a collector and an emitter connected to the first output terminal and a terminal to which a reference potential is applied, respectively. A PMIS 1303 has a drain connected to a base of the first BJT 1301, a gate connected to a first input terminal 1310, and a source connected to a power supply terminal 1340. An NMIS 1304 has a drain, connected to the base of the first BJT 1301, a gate connected to the second input terminal 1320, and a source connected to the base of the second BJT 1302. A capacitor 1305 has one terminal connected to the first input signal terminal 1310 and the other terminal connected to the base of the second BJT 1302. A discharging circuit 1306 has an input terminal connected to the base of the first BJT, and an output terminal connected to a terminal to which a reference potential is applied. A potential setting circuit 1307 has an input terminal connected to the power supply terminal 1340 and an output terminal connected to the base of the second BJT 1302. The drain of the PMIS 1303 is connected to a second output terminal 1350 and the base of the second BJT 1302 serves as the node 1360.

An operation of this embodiment is basically same as that in the embodiment shown in FIG. 1. The capacitor, the discharging circuit and the potential setting circuit shown in FIGS. 1, 5, and 9 are combined as shown in FIG. 13. As a result, a high-speed and low-power circuit can be achieved. Note that any two of the capacitor, the discharging circuit, and the potential setting circuit may be combined.

Figure 14:
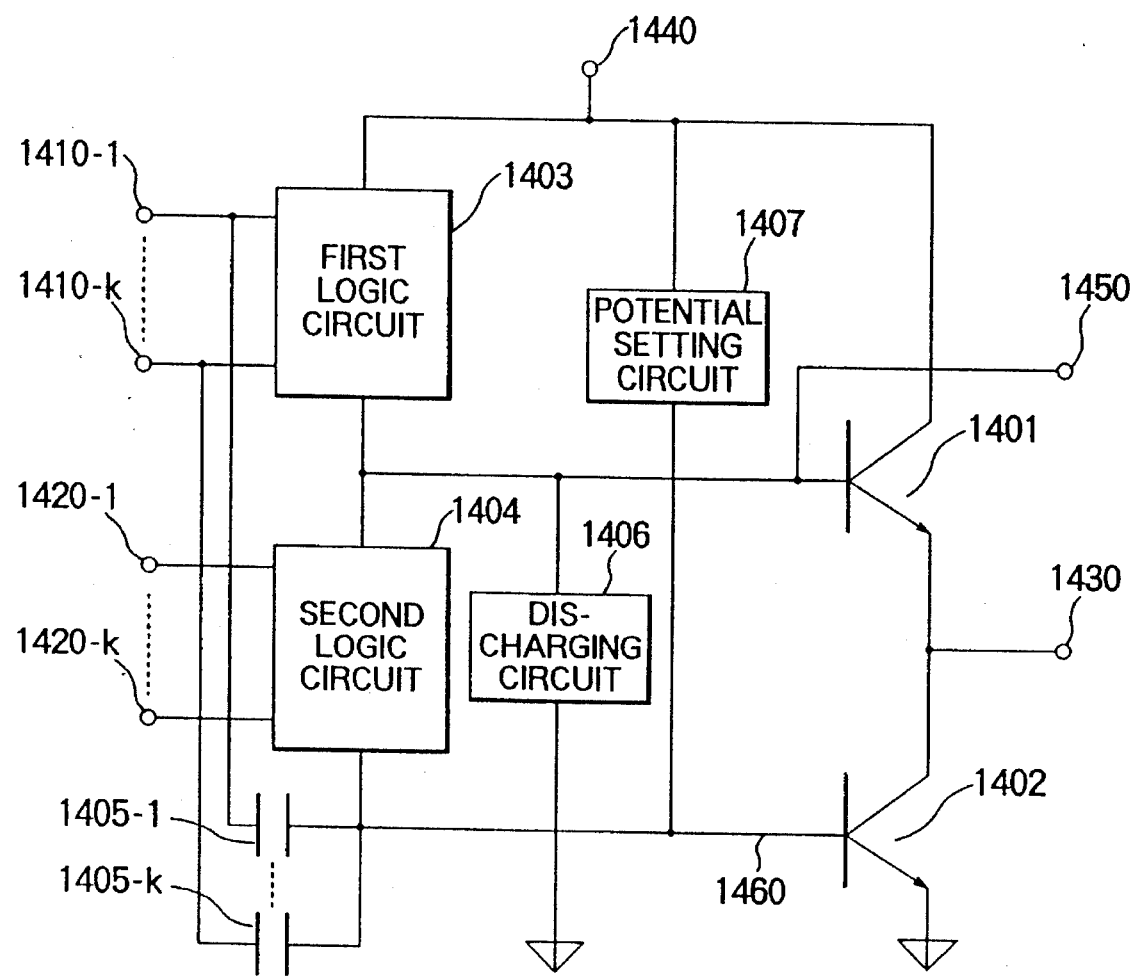
FIG. 14 is a circuit diagram showing a BiMIS circuit according to a ninth embodiment of the present invention.

FIG. 14 shows a ninth embodiment of the present invention. In this embodiment, a first BJT 1401 has a collector and an emitter connected to a power supply terminal 1440 and a first output terminal 1430, respectively. A second BJT 1402 has a collector and an emitter connected to a first output terminal 1430 and a terminal to which a reference potential is applied, respectively. A first logic circuit 1403 is connected between the power supply terminal 1440 and a base of the first BJT 1401, and has k input terminals 1410-1 through 1410-k. A second logic circuit 1404 is connected between the base of the first BJT 1401 and a base of the second BJT 1402, and has k input terminals 1420-1 through 1420-k. Capacitors 1405-1 through 1405-k have one terminals connected to the input terminals 1410-1 through 1410-k and other terminals connected to the base of the second BJT 1402. A discharging circuit 1406 has an input terminal connected to the base of the first BJT 1401 and an output terminal connected to a terminal to which the reference potential is applied. A potential setting circuit 1407 has an input terminal connected to the power supply terminal 1440 and an output terminal connected to the base of the second BJT 1402. The base of the first BJT 1401 is connected to a second output terminal 1450 and the base of the second BJT 1402 serves as a node 1460.

An operation of this embodiment will now be described. Assume now that the same signal is applied to the input terminals 1410-i and 1420-i ($1 \leq i \leq k$). If the logic circuit 1403 is arranged to be turned on only when all the k input signals are at a low-level potential and the logic circuit 1404 is arranged to be turned on when any of k input signals is at a high-level potential, the circuit shown in FIG. 14 operates as a NOR circuit. Further, if the logic circuit 1403 is arranged to be turned on when any of the k input signals is at the low-level potential and the logic circuit 1404 is arranged to be turned on only when all the k input signals at the high-level potential, the circuit shown in FIG. 14 operates as a NAND circuit.

Figure 15:
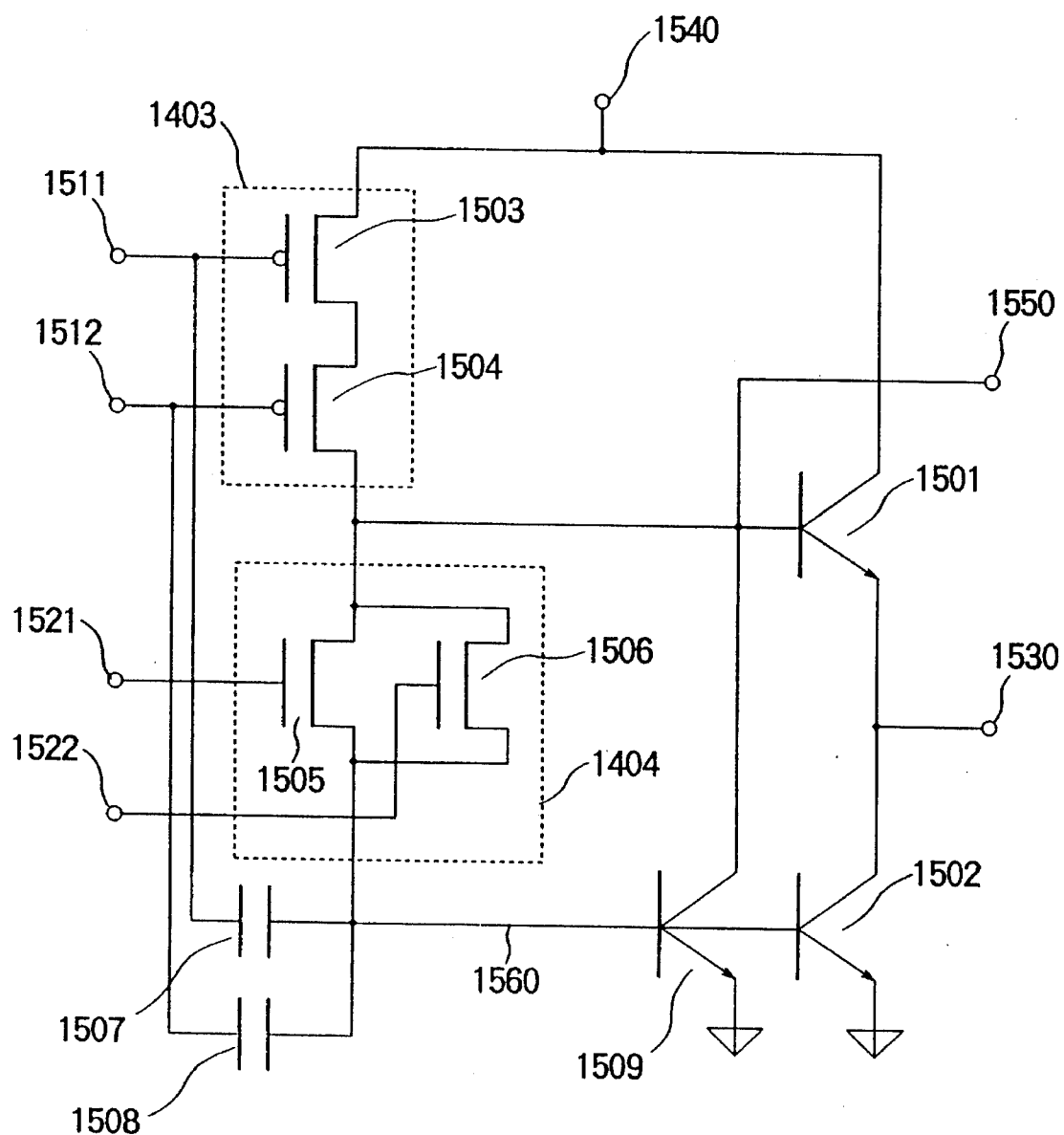
FIG. 15 is a circuit diagram of a BiMIS circuit according to a tenth embodiment in which the circuit in the ninth embodiment of the present invention is more specific.

A tenth embodiment in which the embodiment shown in FIG. 14 is further detailed will now be described with reference to FIG. 15.

In this embodiment, a first BJT 1501 has a collector and an emitter connected to a power supply terminal 1540 and a first output terminal 1530, respectively. A second BJT 1502 has a collector and an emitter connected to the first output terminal 1530 and a terminal to which a reference potential is applied, respectively. A first PMIS 1503 has a gate and a source connected to a first input terminal 1511 and a power supply terminal 1540, respectively. A second PMIS 1504 has a drain connected to a base of the first BJT 1501, a gate connected to a second input terminal 1512, and a source connected to a drain of the first PMIS 1503. A first NMIS 1505 has a drain connected to the base of the first BJT 1501, a gate connected to a third input terminal 1521, and a source connected to a base of the second BJT 1502. A second NMIS 1506 has a drain connected to the base of the first BJT 1501, a gate connected to a fourth input signal 1522, and a source connected to the base of the second BJT 1502. A first capacitor 1507 has one terminal connected to the first input terminal 1511 and the other terminal connected to the base of the second BJT 1502. A second capacitor 1508 has one terminal connected to the second input terminal 1512 and the other terminal connected to the base of the second BJT 1502. A third BJT 1509 has a collector connected to the base of the first BJT 1501, an emitter connected to the base of the second BJT 1502, and an emitter connected to a terminal to which a reference potential is applied. The drain of the second PMIS 1504 is connected to a second output terminal 1550 and the base of the second BJT 1502 serves as a node 1560. The circuit in this embodiment constitutes a two-input NOR logic circuit.

An operation of this embodiment will now be described. Assume now that a same signal is applied to the input terminals 1511, 1521, 1512, and 1522. When a signal having a potential at which the PMISs 1503 and 1504 are turned on and the NMISs 1505 and 1506 are turned off is applied to the input terminals 1511, 1512, 1521, and 1522, the potential of the second output terminal 1550 raises to the potential of the power supply terminal 1540. Further, since the NMISs 1505 and 1506 are remained off, the potential of the node 1560 drops to the potential at which the second BJT 1502 is turned off. Since the potential of the second output terminal 1550 raises to the potential of the power supply terminal 1540, the potential of the first output terminal 1530 drops by Vf from the potential of the power supply terminal 1540. When a signal having a potential at which the NMIS 1505 is turned on and the PMIS 1503 is turned off is applied to the input terminals 1511, 1512, 1521, and 1522, the second output terminal 1550 is conducted with the node 1560. Accordingly, the potential of the second output terminal 1550 drops and the potential of the node 1560 raises so that the these two potentials become identical. The sizes of the PMIS, the NMIS and the BJT are adjusted so as to turn on the second BJT 1502 at this time. When the second BJT 1502 is turned on, the potential of the first output terminal 1530 drops. Since the PMIS 1503 remains off, the base current supplied to the second BJT 1502 is gradually decreased so that the second BJT 1502 is turned off. The potential of the first output terminal 1530 drops to the reference potential by adjusting the base current of the second BJT 1502 and the load current of the first output terminal 1530. Furthermore, the potential of the second output terminal 1550 drops to such a potential at which the second BJT 1502 is turned off.

Figure 16:
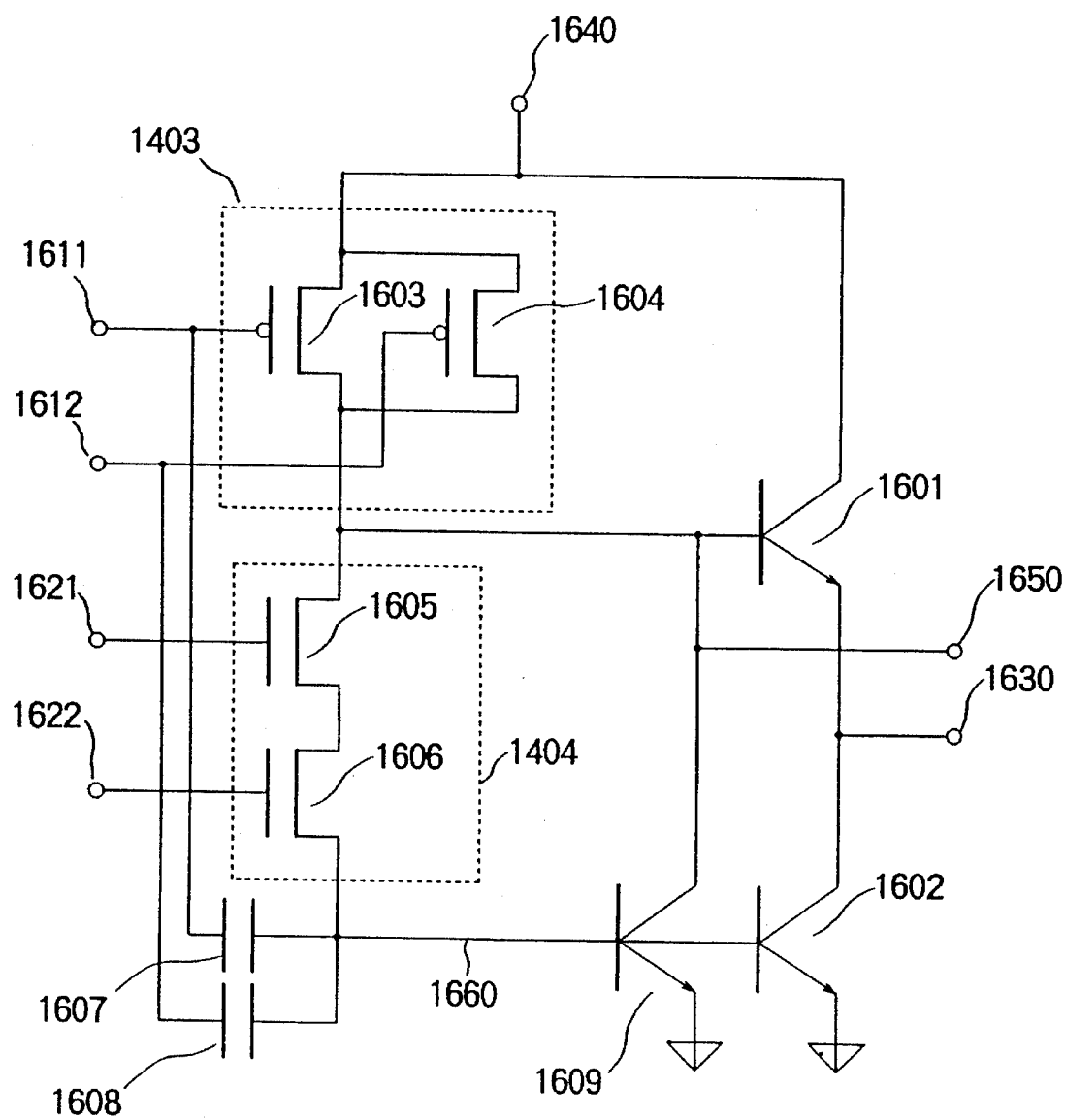
FIG. 16 is a circuit diagram of a BiMIS circuit according to an eleventh embodiment in which the BiMIS circuit in the ninth embodiment of the present invention is further detailed.

An eleventh embodiment in which the embodiment shown in FIG. 14 is further detailed will now be explained with reference to FIG. 16.

In this embodiment, a first BJT 1601 has a collector and an emitter connected to a power supply terminal 1640 and a first output terminal 1630, respectively. A second BJT 1602 has a collector and an emitter connected to the first output terminal 1630 and a terminal to which a reference potential is applied, respectively. A first PMIS 1603 has a drain connected to a base of the first BJT 1601, a gate connected to a first input terminal 1611, and a source connected to the power supply terminal 1640. A second PMIS 1604 has a drain connected to the base of the first BJT 1601, a gate connected to a second input terminal 1612, and a source connected to the power supply terminal 1640. A first NMIS 1605 has a drain and a gate connected to the base of the first BJT 1601 and a third input terminal 1621, respectively. A second NMIS 1606 has a drain connected to a source of the first NMIS 1605, a gate connected to a fourth input terminal 1622, and a source connected to a base of the second BJT 1602. A first capacitor 1607 has one input terminal connected to the first input terminal 1611 and the other terminal connected to the base of the second BJT 1602. A second capacitor 1608 has one terminal connected to the second input terminal 1612 and the other terminal connected to the base of the second BJT 1602. A third BJT 1609 has a collector connected to the base of the first BJT 1601, a base connected to the base of the second BJT 1602 and an emitter connected to the terminal to which the reference potential is applied. The drain of the second PMIS 1604 is connected to a second output terminal 1650 and the base of the second BJT 1602 serves as a node 1660. The circuit of this embodiment constitutes a two-input NAND logic.

An operation of this embodiment will now be described. Assume now that the signals input to the input terminals 1611 and 1621, and 1612 and 1622 are identical. When signals having potentials at which the PMISs 1603 and 1604 are turned on and the NMISs 1605 and 1506 are turned off are input to the input terminals 1611, 1612, 1621, and 1622, the potential of the second output terminal 1650 raises to the potential of the power supply terminal 1640. Further, the potential of the node 1660 drops to the potential at which the second BJT 1602 is turned off since the NMIS 1605 is turned off. The potential of the first output terminal 1630 is less than the potential of the power supply terminal 1640 by Vf since the potential of the second output terminal 1650 raises to the potential of the power supply terminal 1640.

When signals having potentials at which the NMISs 1605, 1606 are turned on and the PMISs 1603, 1604 are turned off, are applied to the input terminals 1611, 1621, 1612, and 1622, the second output terminal 1650 is conducted with the node 1660. As a result, the potential of the second output terminal 1650 drops and the potential of the node 1660 raises so that their potentials become identical. The sizes of the PMIS, the NMIS, and the BJT are adjusted so as to turn on the second BJT 1602 at this time.

When the second BJT 1602 is turned on, the potential of the first output terminal 1630 drops. Since the PMISs 1603, 1604 are turned off, the base current of the second BJT 1602 is gradually decreased and finally the second BJT 1602 is turned off. By adjusting the base current of the second BJT 1602 and the load current of the first output terminal 1630, the potential of the first output terminal 1630 drops to the reference potential. Furthermore, the potential of the second output terminal 1650 drops to the potential at which the second BJT 1602 is turned off.

Figure 17:
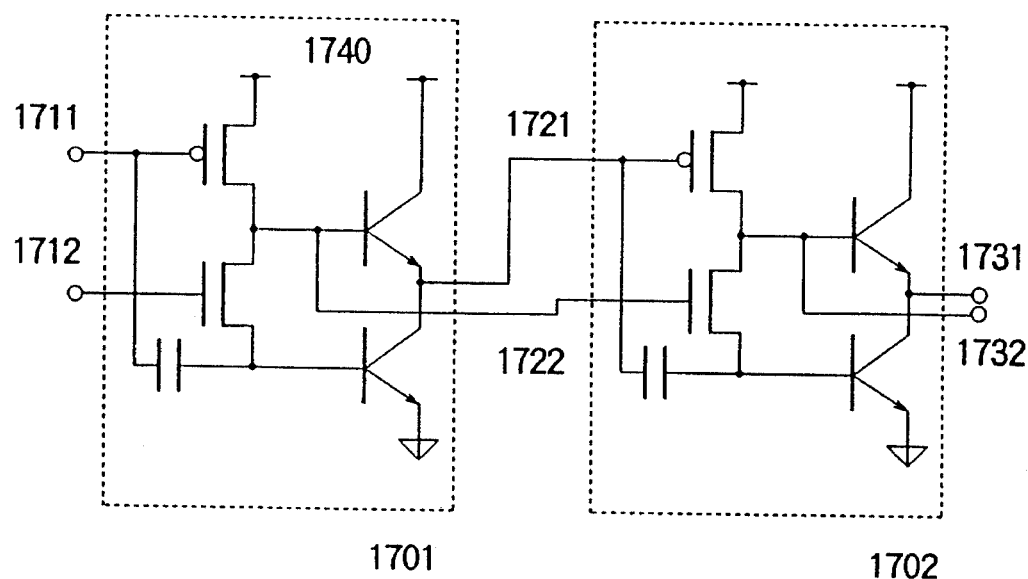
FIG. 17 is a circuit diagram of a BiMIS circuit according to a twelfth embodiment of the present invention.

FIG. 17 shows the twelfth embodiment. This embodiment shows how to connect the logic circuits of the embodiment shown in FIG. 1. A first BiMIS logic circuit 1701 has first and second input terminals connected to first and second input terminals 1711, 1712, respectively. A second BiMIS logic circuit 1702 has first and second input terminals and first and second output terminals connected to the output terminals 1721, 1722 of the first BiMIS logic circuit 1701, and first and second output terminals 1731, 1732, respectively.

An operation of this embodiment will now be described. As has been explained in the embodiment shown in FIG. 1, when an input low-level potential is applied to the input terminals 1711, 1712, the high-level potential less than the potential of the power supply terminal 1740 by Vf, and the potential raised to the potential of the power supply terminal 1740 are output from the output terminals 1721, 1722, respectively. When an input high-level potential is applied to the input terminals 1711, 1712, the low-level potential of the reference potential and the low-level potential higher than the reference potential by Vf are output from the output terminals 1721, 1722, respectively.

Figure 18:
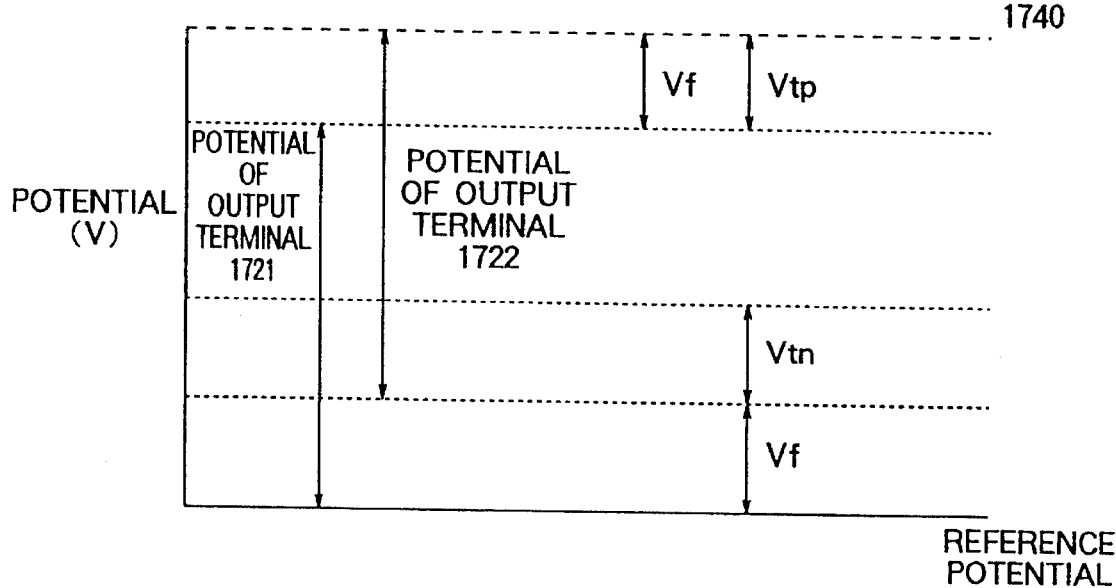
FIG. 18 is a view for explaining an operation of the BiMIS circuit according to the twelfth embodiment of the present invention.

These levels are shown in FIG. 18.

By adjusting the second input terminal 1722 of the BiMIS logic circuit 1702 to the second output terminal of the BiMIS logic circuit 1701 in the upstream, the amplitude of the input signal is decreased by the base-emitter potential Vbe of the BJT. For this reason, a high-speed switching operation can be achieved.

Figure 19:
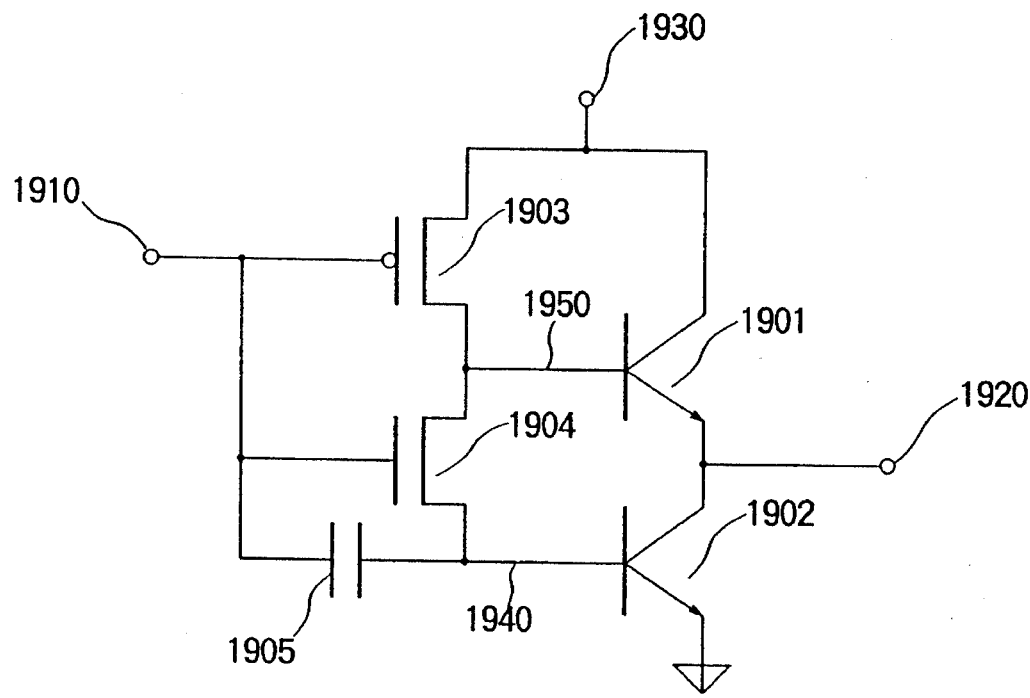
FIG. 19 is a circuit diagram showing a BiMIS circuit according to a thirteenth embodiment of the present invention.

FIG. 19 is a circuit diagram showing a thirteenth embodiment of the present invention.

In this embodiment, a first BJT 1901 has a collector and an emitter connected to a power supply terminal 1930 and an output terminal 1920, respectively. A second BJT 1902 has a collector and an emitter connected to the output terminal 1920 and a terminal to which a reference potential is applied, respectively. A PMIS 1903 has a drain connected to a base of the first BJT 1901, a gate connected to an input terminal 1910, and a source connected to the power supply terminal 1930. An NMIS 1904 has a drain connected to the base of the first BJT 1901, a gate connected to the input terminal 1910, and a source connected to a base of the second BJT 1902. A capacitor 1905 has one terminal connected to the input terminal 1901 and the other terminal connected to the base of the second BJT 1902. The drain of the PMIS 1903 is connected to a node 1950 and the base of the second BJT 1902 serves as a node 1904.

An operation of this embodiment will now be described. When a signal using a potential at which the PMIS 1903 is turned on and the NMIS 1904 is turned off is applied to the input terminal 1910, the potential of the node 1950 raises to the potential of the power supply terminal 1930. Further, the potential of the node 1940 drops to the potential at which the second BJT 1902 is turned off since the NMIS 1904 is turned off. The potential of the output terminal 1920 drops by Vf from the potential of the power supply terminal 1930 since the potential of the node 1950 raises to the potential of the power supply terminal 1930.

When a signal having a potential at which the NMIS 1904 is turned on and the PMIS 1903 is turned off is applied to the input terminal 1910, the node 1950 is conducted with the node 1940. Accordingly, the potential of the node 1950 drops and the potential of the node 1940 raises so that these potential become identical. The sizes of the PMIS, NMIS, and BJT are adjusted so that the second BJT 1902 is turned on at this time. When the second BJT 1902 is turned on, the potential of the output terminal 1920 drops. Since the PMIS 1903 is turned off, the base current of the second BJT 1902 is gradually decreased and finally the BJT 1902 is turned off. By adjusting the base current of the second BJT 1902 and the load current of the output terminal 1920, the potential of the output terminal 1920 drops to the reference potential. Further, the potential of the node 1950 drops to the potential at which the second BJT 1902 is turned off.

Figure 20:
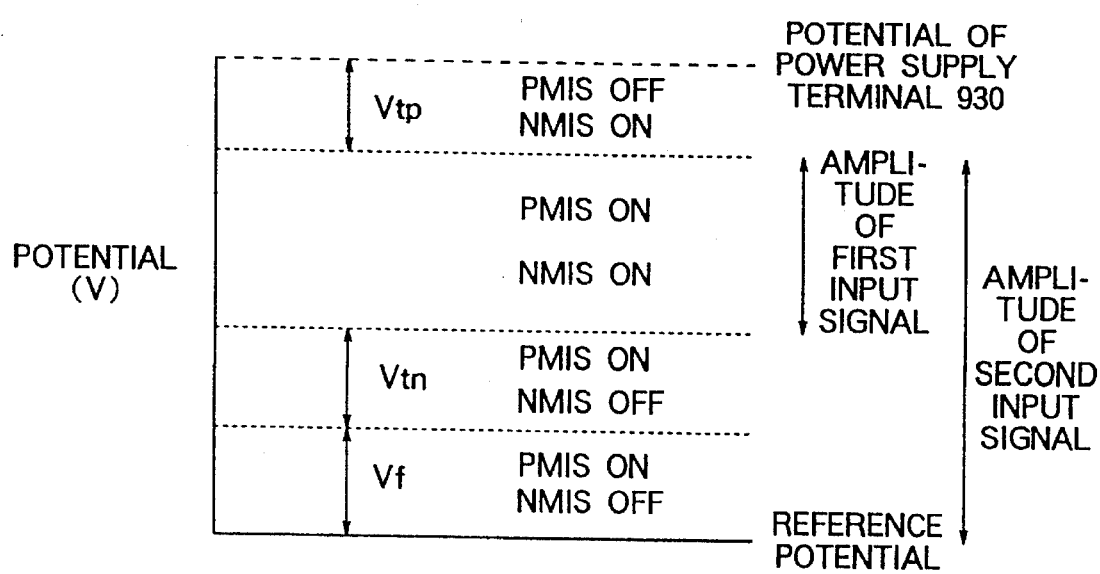
FIG. 20 is a view for explaining an operation of the BiMIS circuit according to the thirteenth embodiment of the present invention.

The potentials indicating the above operation is shown in FIG. 20. By adjusting the high-level potential and the low-level potential of the signal supplied to the input terminal 1910, the amplitude 2010 of the input signal can be converted into the amplitude 2020 of the output signal. The advantage of the capacitor 1905 is same as that explained in the embodiment shown in FIG. 1.

Figure 21:
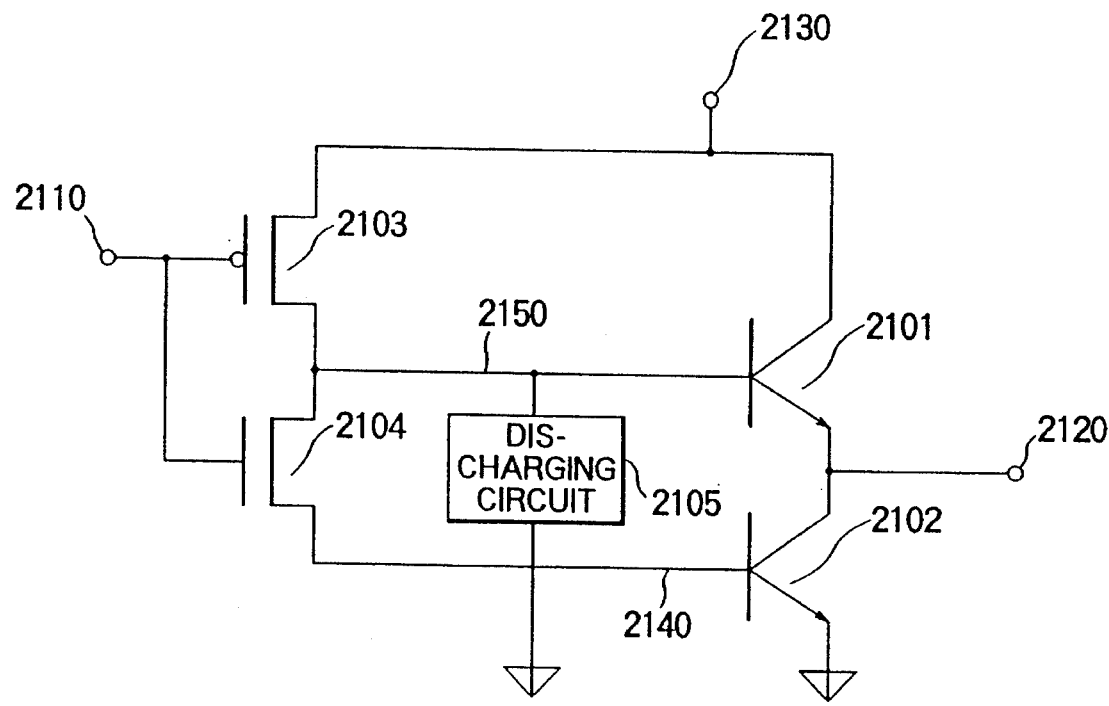
FIG. 21 is a circuit diagram of a BiMIS circuit according to a fourteenth embodiment of the present invention.

FIG. 21 shows a fourteenth embodiment of the present invention. In this embodiment, a first BJT 2101 has a collector and an emitter connected to the power supply terminal 2130 and the output terminal 2120, respectively. A second BJT 2102 has a collector and an emitter connected to the output terminal 2120 and a terminal to which a reference potential is applied, respectively. A PMIS 2103 has a drain connected to a base of the first BJT 2101, a gate connected to an input terminal 2110, and a source connected to the power supply terminal 2130. An NMIS 2104 has a drain connected to the base of the first BJT 2101, a gate connected to the input terminal 2110, and source connected to a base of the second BJT 2102. A discharging circuit 2105 has an input terminal connected to the base of the first BJT 2101 and an output terminal connected to the reference potential. The drain of the PMIS 2103 serves as a node 2150 and the base of the second BJT 2102 serves as a node 2140.

An operation of this embodiment is same as that of the embodiment shown in FIG. 19. An advantage of the discharging circuit 2105 is same as that of the embodiment shown in FIG. 5.

Figure 22:
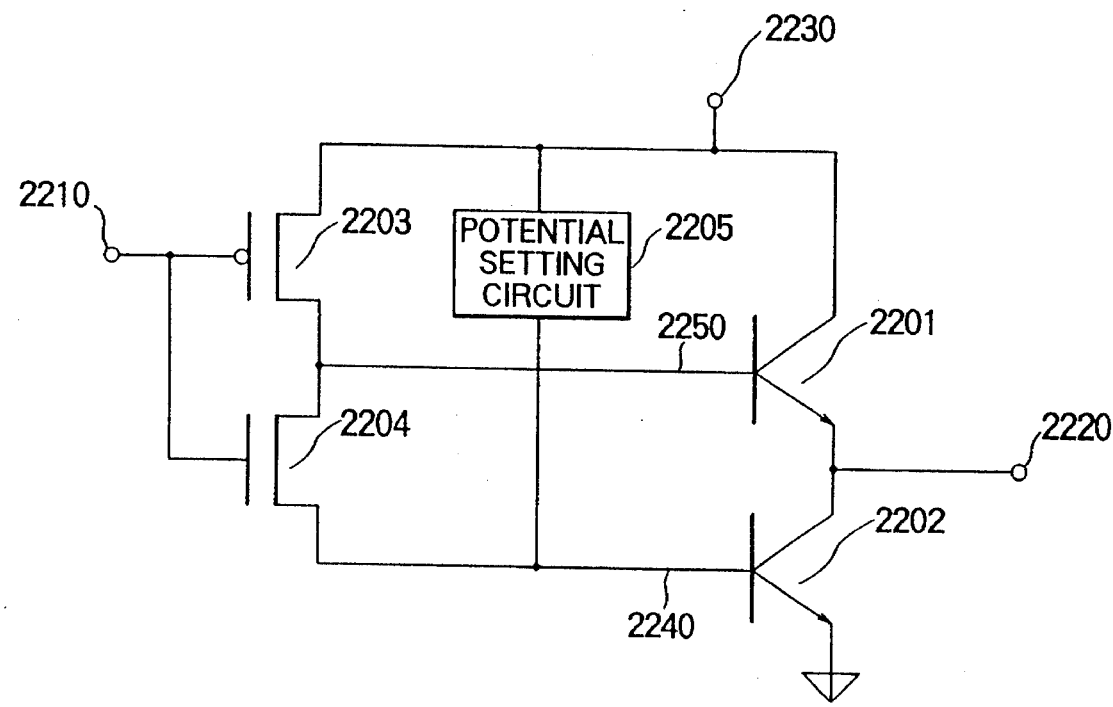
FIG. 22 is a circuit diagram of a BiMIS circuit according to a fifteenth embodiment of the present invention.

FIG. 22 shows a fifteenth embodiment of the present invention. In this embodiment, a first BJT 2201 has a collector and an emitter connected to a power supply terminal 2230 and an output terminal 2220, respectively. A second BJT 2202 has a collector and an emitter connected to the output terminal 2220 and a terminal to which a reference potential is applied, respectively. A PMIS 2203 has a drain connected to a base of the first BJT 2201, a gate connected to an input terminal 2210, and a source connected to the power supply terminal 2230. An NMIS 2204 has a drain connected to the base of the first BJT 2201, a gate connected to the input terminal 2210, and a source connected to a base of the second BJT 2202. A potential setting circuit 2205 has an input terminal connected to the power supply terminal 2230 and an output terminal connected to the base of the second BJT 2202. The drain of the PMIS 2203 serves as the node 2250 and the base of the second BJT 2202 serves as the node 2240.

An operation of this embodiment is basically same as that of the embodiment shown in FIG. 19. An advantage of the potential setting circuit 2205 is same as that of the embodiment shown in FIG. 9.

Figure 23:
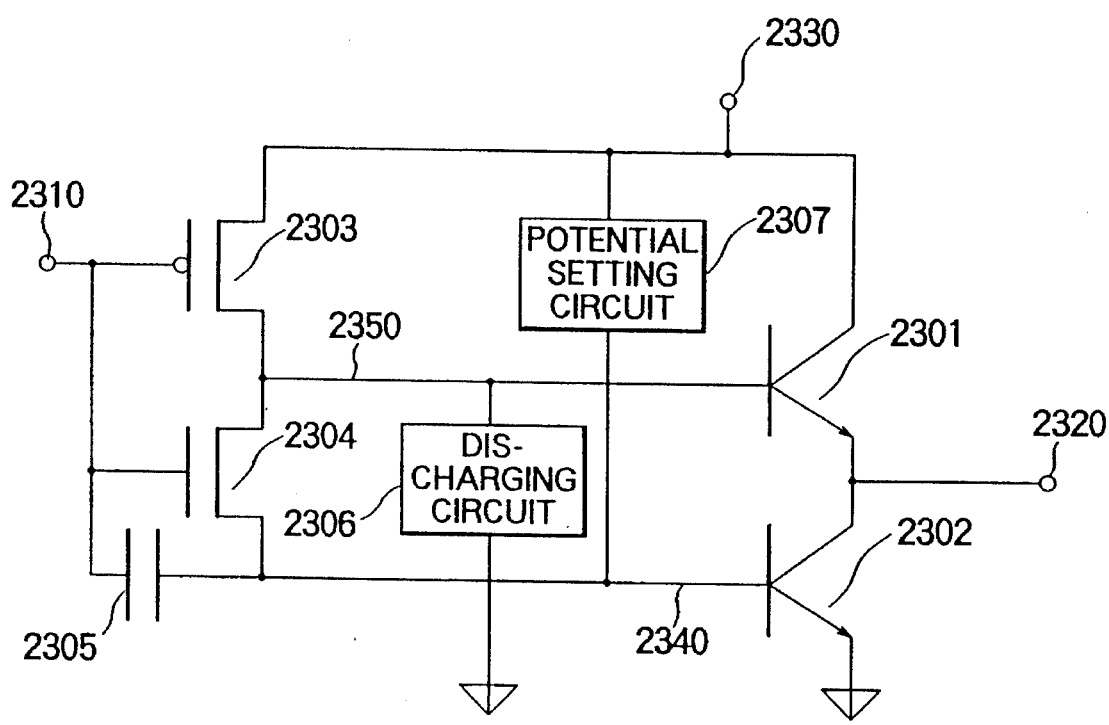
FIG. 23 is a circuit diagram showing a BiMIS circuit according to a sixteenth embodiment of the present invention.

FIG. 23 shows a sixteenth embodiment. In this embodiment, a first BJT 2301 has a collector and an emitter connected to a power supply terminal 2330 and an output terminal 2320, respectively. A second BJT 2302 has a collector and an emitter connected to an output terminal 2320 and a terminal to which a reference potential is applied, respectively. A PMIS 2303 has a drain connected to a base of the first BJT 2301, a gate connected to an input terminal 2310, and a source connected to the power supply terminal 2330. An NMIS 2304 has a drain connected to the base of the first BJT 2301, a gate connected to the input terminal 2310, and a source connected to the base of the second BJT 2302. A capacitor 2305 has one terminal connected to the input terminal 2310 and the other terminal connected to the base of the second BJT 2302. A discharging circuit 2306 has an input terminal connected to the base of the first BJT 2301 and an output terminal connected to a terminal to which a reference potential is applied. A potential setting circuit 2307 has an input terminal connected to the power supply terminal 2330 and an output terminal connected to the base of the second BJT 2302. The drain of the PMIS 2303 serves as a node 2350 and the base of the second BJT 2302 serves as a node 2340.

An operation of this embodiment is basically same as that of the nineteenth embodiment. The capacitor, the discharging circuit, and the potential setting circuit shown in FIGS. 19, 21, and 22, respectively are combined as shown in the sixteenth embodiment to achieve a high-speed and low-power operation. Note that any two of the capacitor, the discharging circuit and the potential setting circuit may be combined.

Figure 24:
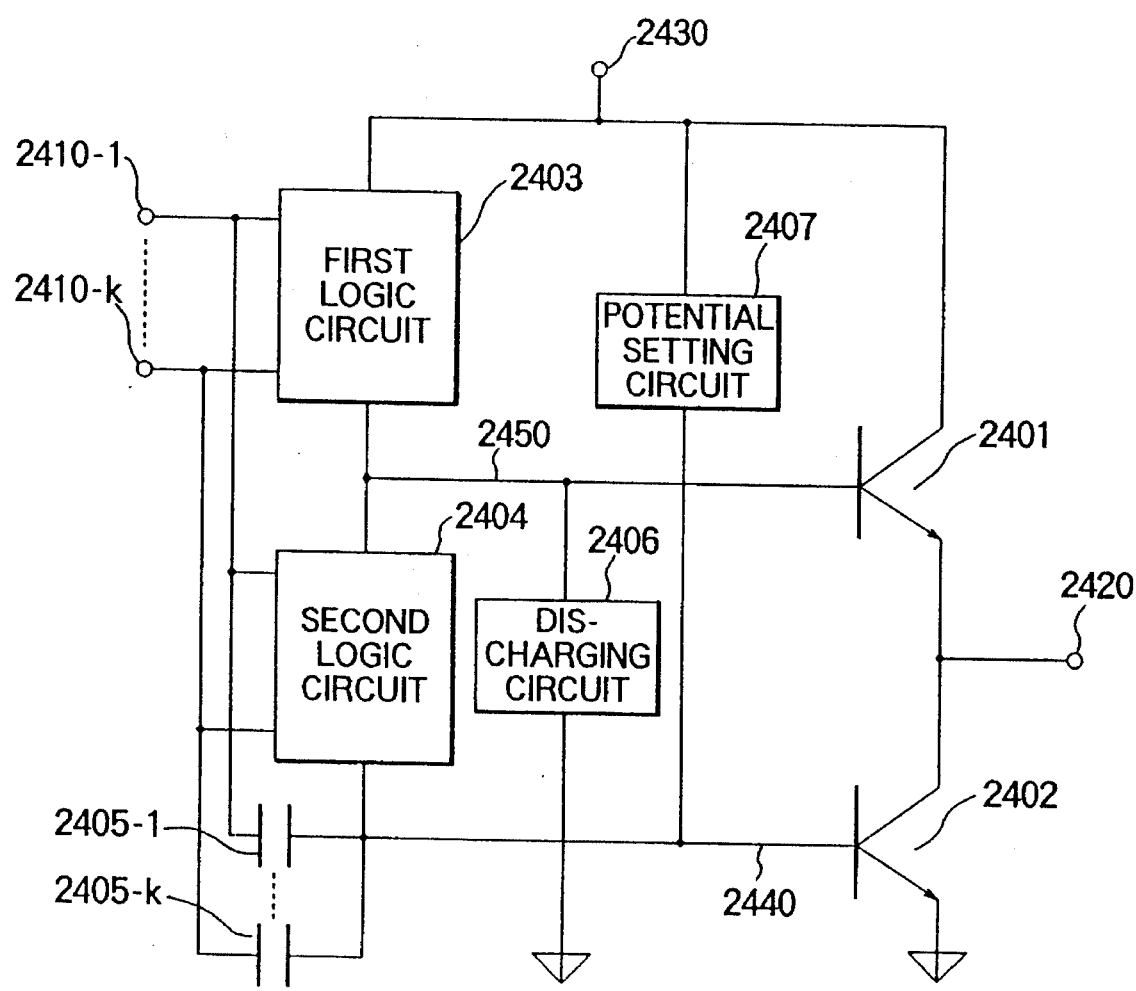
FIG. 24 is a circuit diagram showing a BiMIS circuit according to a seventeenth embodiment of the present invention.

FIG. 24 shows a seventeenth embodiment according to the present invention. In this embodiment, a first BJT 2401 has a collector and an emitter connected to a power supply terminal 2430 and an output terminal 2420, respectively. A second BJT 2402 has a collector and an emitter connected to the output terminal and a terminal to which a reference potential is applied, respectively. A first logic circuit 2403 connected between the power supply terminal 2430 and the base of the first BJT 2401, and to which connected are k input terminals 2410-1 through 2410-k. A second logic circuit 2404 connected between the base of the first BJT 2401 and the base of the second BJT 2402, and to which connected are the k input terminals 2420-1 through 2420-k. Capacitors 2405-1 through 2405-k one input terminals of which are connected to the k input terminals 2410-1 through 2410-k, respectively and the other terminals of which are connected to the base of the second BJT 2402. A discharging circuit 2406 has an input terminal connected to the base of the first BJT 2401 and an output terminal connected to a terminal to which a reference potential is applied. A potential setting circuit 2407 has an input terminal connected to the power supply terminal 2430 and an output terminal connected to the base of the second BJT 2402. The base of the first BJT 2401 serves as a node 2450 and the base of the second BJT 2402 serves as a node 2440.

An operation of this embodiment will now be described.

The circuit shown in FIG. 24 serves as a NOR circuit by arranging such that the logic circuit 2403 is turned on only when all of the k input signals are at the input low-level and the logic circuit 2404 is turned on when at least one of the k input signals is at the input high-level. Further, the circuit shown in FIG. 24 serves as a NAND circuit by arranging such that the logic circuit 2403 is turned on when at least one of k input signals is at the input low-level and the logic circuit 2404 is turned on only when all the k input signals are at the input high-level.

Figure 25:
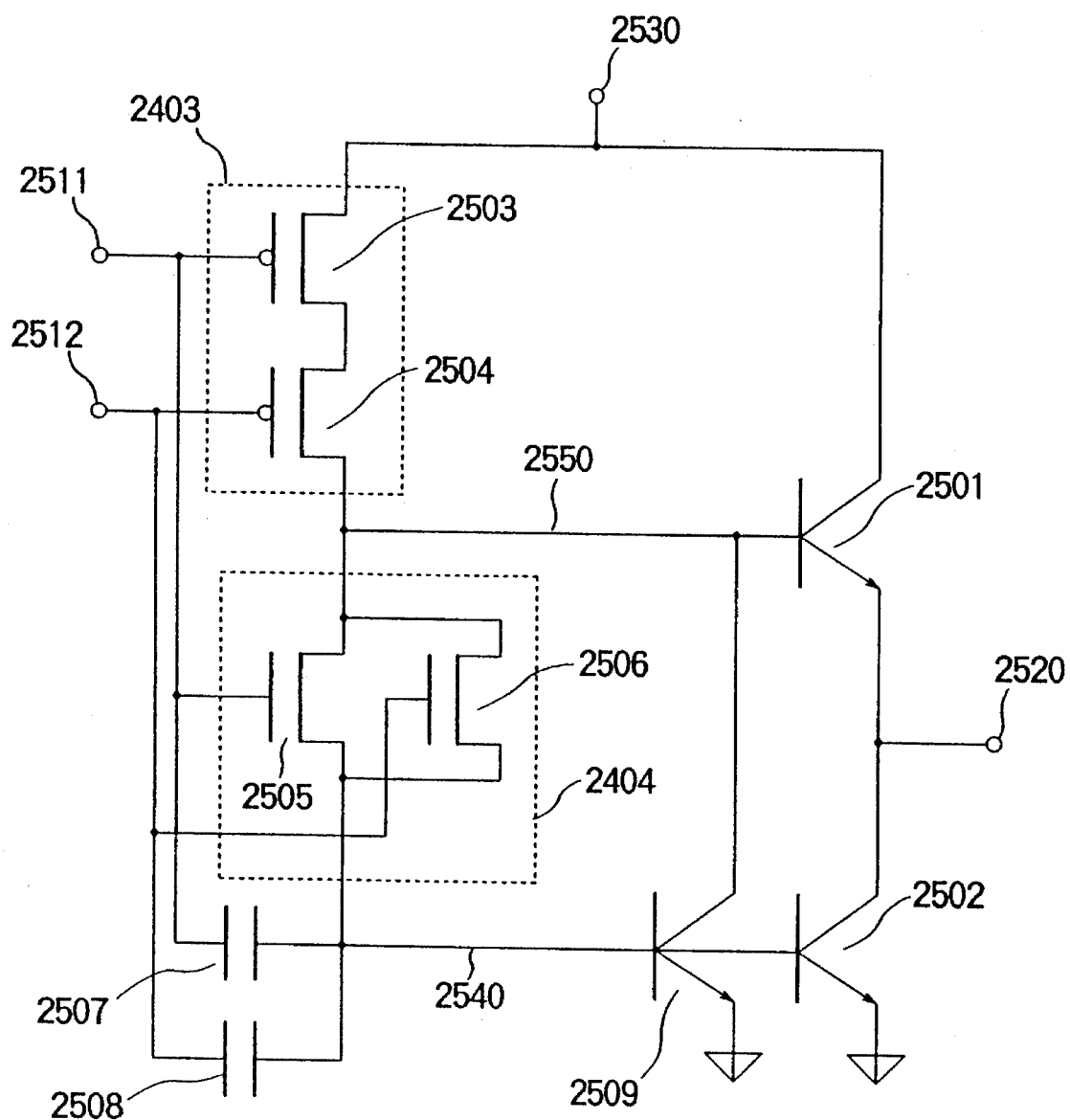
FIG. 25 is a circuit diagram showing a BiMIS circuit according to an eighteenth embodiment in which the BiMIS circuit in the seventeenth embodiment is further detailed.

Eighteenth and nineteenth embodiments in which the embodiment shown in FIG. 24 is further detailed will now be described. FIG. 25 shows the eighteenth embodiment. In this embodiment, a first BJT 2501 has a collector and an emitter connected to the power supply terminal 2530 and the output terminal 2520, respectively. A second BJT 2502 has a collector and an emitter connected to the output terminal 2520 and a terminal to which a reference potential is applied. A first PMIS 2503 has a gate and a source connected to a first input terminal 2511 to which a first input signal is applied and the power supply terminal 2530, respectively. A second PMIS 2504 has a drain connected to the base of the first BJT 2501, a gate connected to a second input terminal 2512, and a source connected to a drain of the first PMIS 2503. A first NMIS 2505 has a drain connected to the base of the first BJT 2501, a gate connected to the first input terminal 2511, and a source connected to the base of the second BJT 2502. A second NMIS 2506 has a drain connected to the base of the first BJT 2501, a gate connected to the second input terminal 2512, and a source connected to the base of the second BJT 2502. A first capacitor 2507 has one terminal connected to the first input terminal 2511 and the other terminal connected to the base of the second BJT 2502. A second capacitor 2508 has one terminal connected to the second input terminal 2512 and the other terminal connected to the base of the second BJT 2502. A third BJT 2509 has a collector connected to the base of the first BJT 2501, a base connected to the base of the second BJT 2502, and an emitter connected to a terminal to which a reference potential is applied. The drain of the second PMIS 2504 serves as a node 2550 and the base of the second BJT 2502 serves as a node 2540. This circuit constitutes a two-input NOR circuit.

An operation of this embodiment will now be described.

When signals having potentials at which the PMISs 2503, 2504 are turned on and the NMISs 2505, 2506 are turned off are input to the input terminals 2511 and 2512, the potential of the node 2550 raises to the potential of the power supply terminal 2530. The potential of the node 2540 drops to a potential at which the second BJT 2502 is turned off since the NMISs 2505, 2506 are turned off. The potential of the output terminal 2520 become a potential less than the potential of the power supply terminal 2530 by Vf since the potential of the node 2550 raises to a potential of the power supply terminal 2530.

When signals having potentials at which the NMIS 2505 is turned on and the PMIS 2503 is turned off are input to the input terminals 2511 and 2512, the node 2550 is conducted with the node 2540. As a result, the potential of the node 2550 drops and the potential of the node 2540 raises so that these two potentials become identical. The sizes of the PMIS, NMIS, and the BJT are adjusted so as to turn on the second BJT 2502 at this time. When the second BJT 2502 is turned on, the potential of the first output terminal 2520 drops. Since the PMIS 2503 is turned off, the supplement of the base current of the second BJT 2502 is gradually decreased, and finally the second BJT 2502 is turned off. By adjusting the base current of the second BJT 2502 and the load current flowing into the output terminal 2520, the potential of the output terminal 2520 drops to the reference potential. Further, the potential of the node 2550 drops to the potential at which the second BJT 2502 is turned off.

Figure 26:
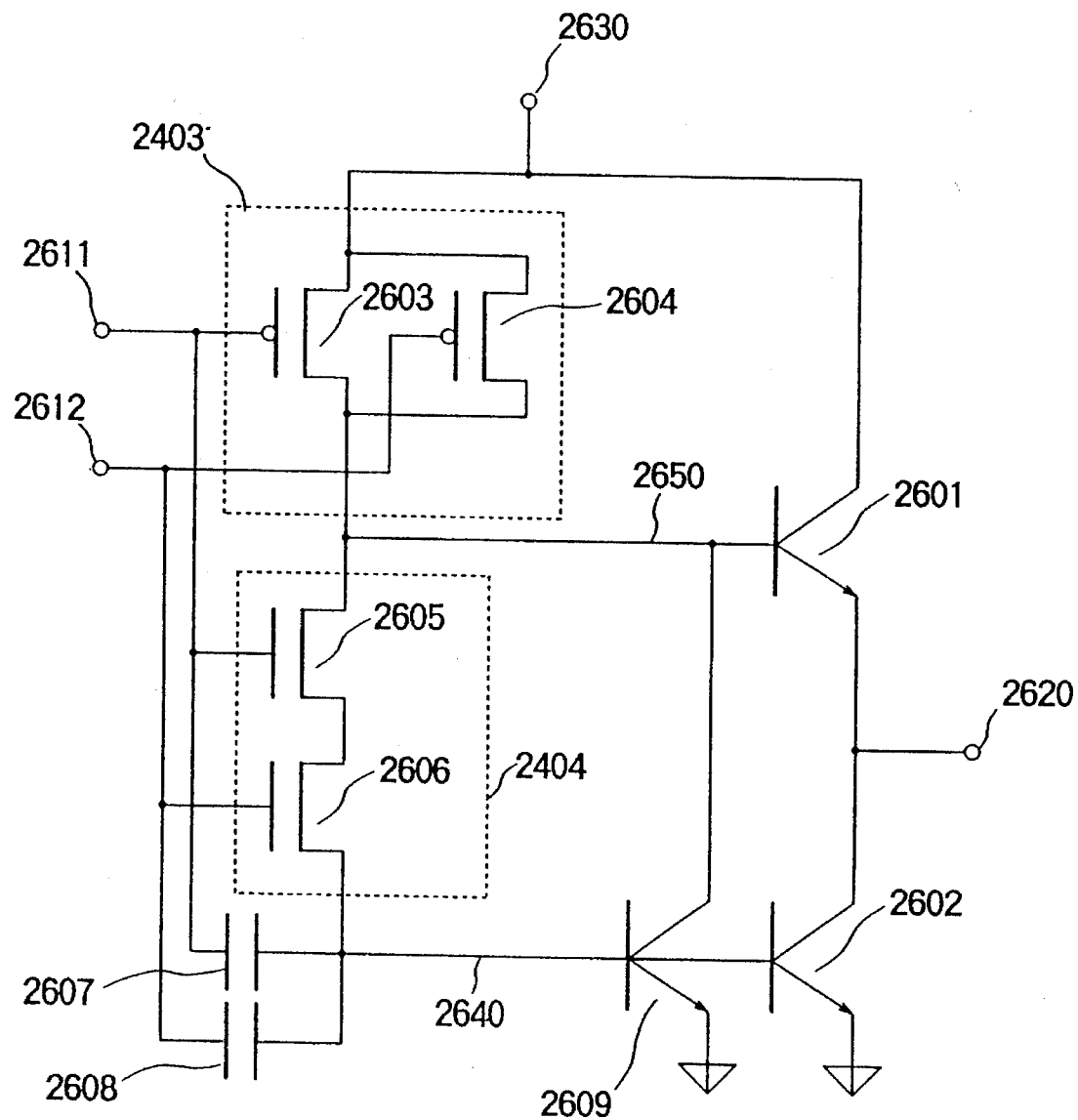
FIG. 26 is a circuit diagram showing a BiMIS circuit according to a nineteenth embodiment in which the BiMIS circuit in the seventeenth embodiment is more specific.
Figure 27:
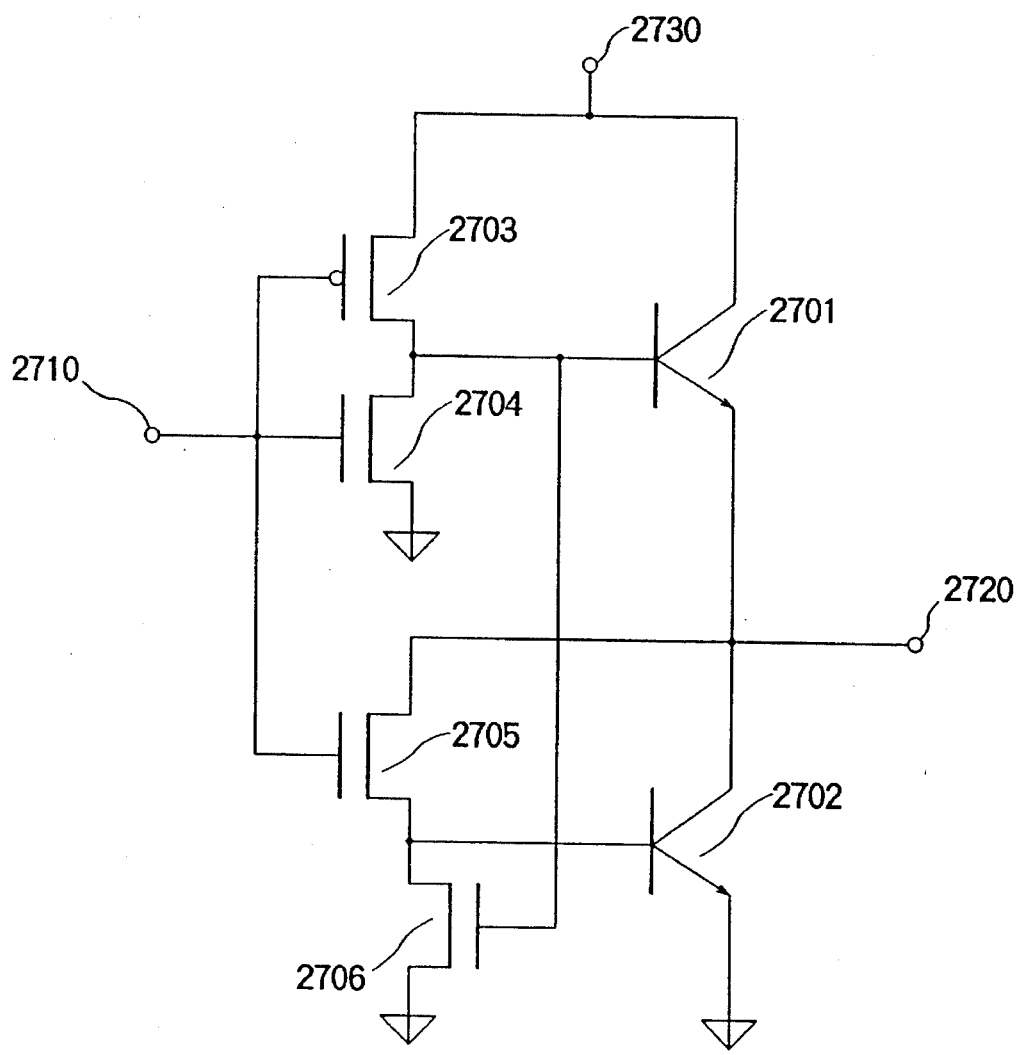
FIG. 27 is a circuit diagram showing a conventional BiCMIS (BJT-CMIS) logic circuit.
Figure 28:
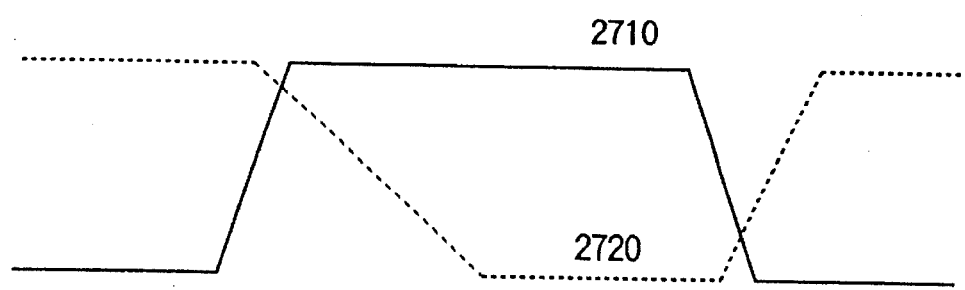
FIG. 28 is a view for explaining an operation of the conventional circuit shown in FIG. 27.
Figure 29:
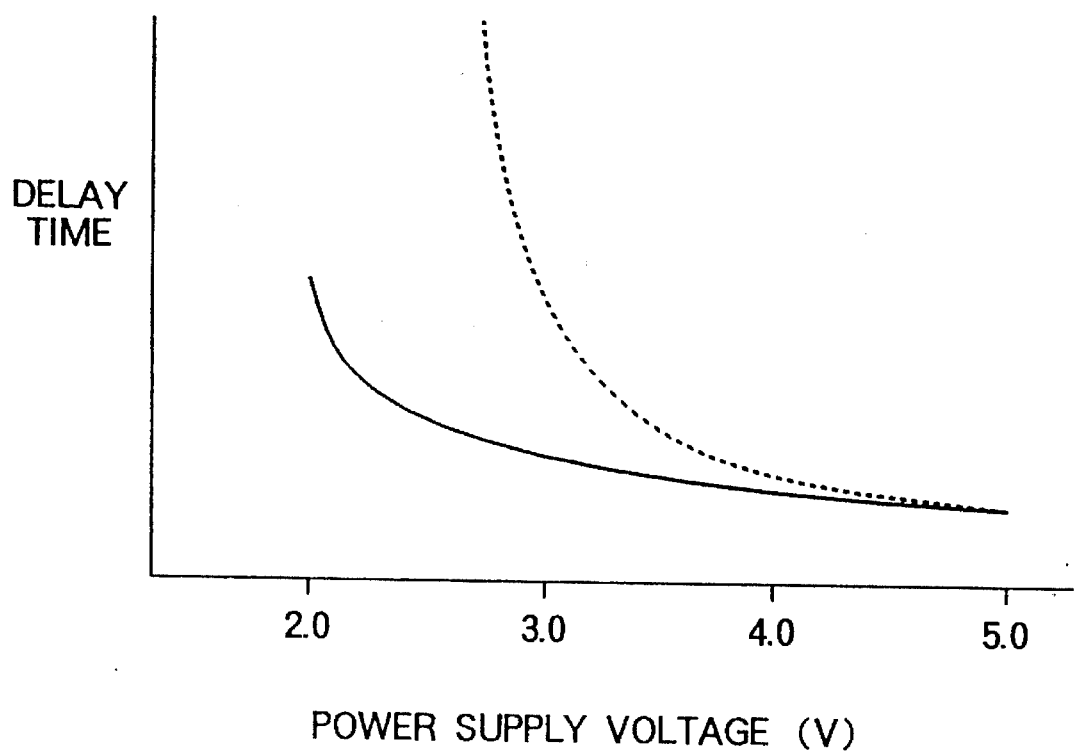
FIG. 29 is a view for explaining an operation of the conventional circuit shown in FIG. 27.
Figure 30:
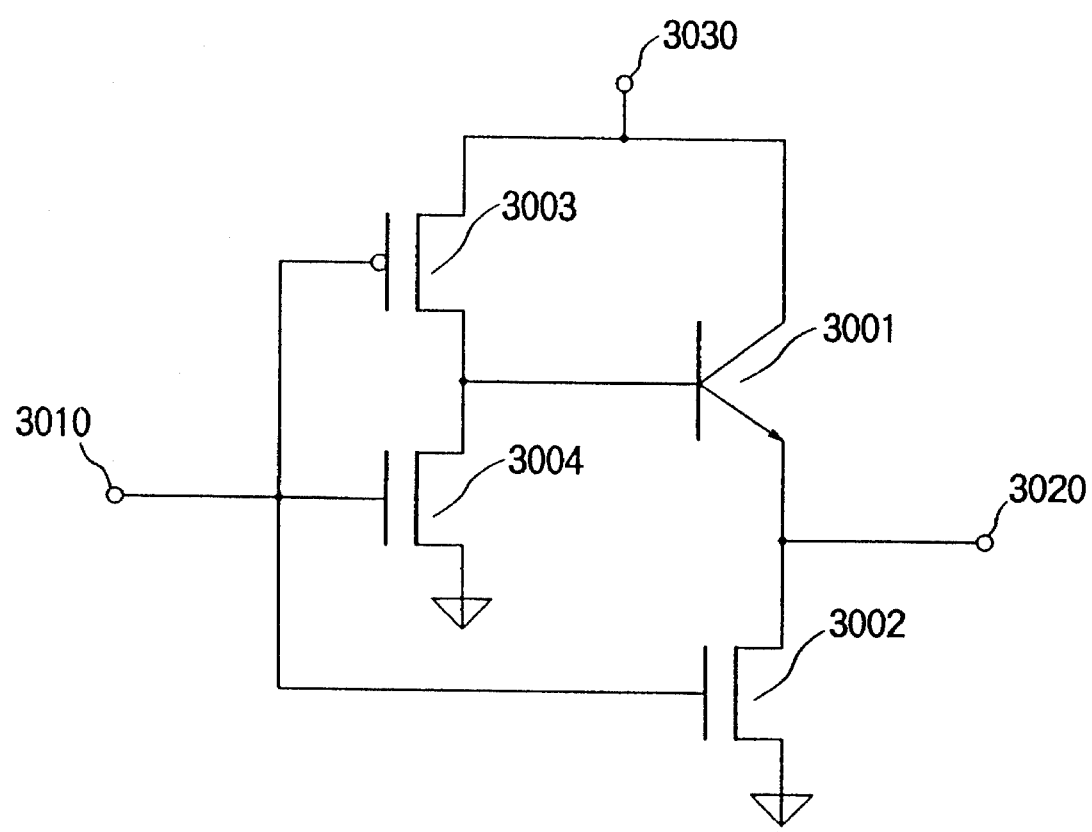
FIG. 30 is a circuit diagram showing a second example of a conventional BJT-CMIS logic circuit.

FIG. 26 shows a nineteenth embodiment of the present invention.

In this embodiment, a first BJT 2601 has a collector and an emitter connected to the power supply terminal 2630 and the output terminal 2620, respectively. A second BJT 2602 has a collector and an emitter connected to the output terminal 2620 and a terminal to which a reference potential is applied, respectively. A first PMIS 2603 has a drain connected to the base of the first BJT 2601, a gate connected to a first input terminal 2611, and a source connected to the power supply terminal 2630. A second PMIS 2604 has a drain connected to the base of the first BJT 2601, a gate connected to a second input terminal 2612, and a source connected to the power supply terminal 2630. A first NMIS 2605 has a drain and a gate connected to the base of the first BJT 2601 and the first input terminal 2611, respectively. A second NMIS 2606 has a drain connected to the source of the first NMIS 2605, a gate connected to the second input terminal 2612, and a source connected to the base of the second BJT 2602. A first capacitor 2607 has one input terminal connected to the first input terminal 2611 and the other terminal connected to the base of the second BJT 2602. A second capacitor 2608 has one terminal connected to the second input terminal 2612 and the other terminal connected to the base of the second BJT 2602. A third BJT 2609 has a collector connected to the base of the first BJT 2601, a base connected to the base of the second BJT 2602, and an emitter connected to a terminal to which a reference potential is applied. The drain of the first BJT 2601 serves as a node 2650 and the base of the second BJT 2602 serves as a node 2640. The circuit in this embodiment constitutes a two-input NAND circuit.

An operation of this embodiment will now be described.

When a signal having a potential at which the PMIS 2603 is turned on and the NMIS 2605 is turned off is input to the input terminal 2611, the potential of the node 2650 raises to a potential of the power supply terminal 2630. Further, the potential of the node 2640 drops to a potential at which the second BJT 2602 is turned off since the NMIS 2605 is turned off. The potential of the output terminal 2620 becomes a potential less than the potential of the power supply terminal 2630 by Vf since the potential of the node 2650 raises to the potential of the power supply terminal 2630.

When signals having potentials at which the NMISs 2605, 2606 are turned on and the PMISs 2603, 2604 are turned off are input to the input terminals 2611, 2612, the node 2650 is conducted with the node 2640. As a result, the potential of the node 2650 drops and the potential of the node 2640 raises so that these two potentials become identical. The sizes of the PMIS, the NMIS, and the BJT are adjusted so as to turn on the second BJT 2602 at this time. When the second BJT 2602 is turned on, the potential of the output terminal 2620 drops. Since the PMISs 2603, 2604 remain off, the supplement of the base current of the second BJT 2602 is gradually decreased and finally the second BJT 2602 is turned off. By adjusting the base current of the second BJT 2602 and the load current of the output terminal 2620, the potential of the output terminal 2620 drops to the reference potential. Further, the potential of the node 2650 drops to a potential at which the second BJT 2602 is turned off.

By setting a threshold potential of the BiMIS logic circuit to a minus value (a depletion type device), the signal lines connected to the gates of the PMISs can be a single common input line, resulting in a simplified circuit arrangement. Further, by adjusting the threshold potential of the NMIS, a level of a logical amplitude of the input signal can be changed. Also, a level of a logical amplitude of the output signal can be changed by adjusting the power supply potential and reference potential.

As has been described above, according to the embodiments of the present invention, since the base potential of the BJT in the output stage is always in the neighborhood of Vf, the BJT can be turned on and off by the slight change of the base current. For this reason, an increase of a signal delay due to the reduction of the amplitude of the input signal as exhibited in the conventional BiCMIS and BiNMIS is not appeared. Accordingly, a high-speed operation with a small amplitude of 3 V or less can be achieved. Furthermore, an implementation of the present invention by an LSI can reduce a power dissipation tailored to the reduction of the power supply potential. Further, unlike the conventional BiCMIS circuit, the base and the collector of the second BJT are not shortcircuited. For this reason, a collector current exists even the emitter-collector potential Vec is about 0 V. Accordingly, the potential of the output signal can drop to the reference potential. Furthermore, by charging and discharging the node within the circuit, the penetration current can be reduced and the low power dissipation can be achieved.

Furthermore, the present invention permits the conventional driving circuit to have a level converting function so that the conventional level converting circuit which has been separately provided can be eliminated. Accordingly, the delay time and the dissipated current can reduced. Furthermore, a logic type level conversion can be achieved so that the logic gate connected to the output of the conventional driving circuit can be built in the circuit of the above embodiments, resulting in further reduction of the delay time.

What is claimed is:

1. A BiMIS logic circuit, comprising:
    at least one first input terminal and at least one second input terminal;
    a first output terminal:
    a first bipolar transistor a collector of which receives a first potential and an emitter of which is connected to the first output terminal;
    a second bipolar transistor a collector of which is connected to the first output terminal and an emitter of which receives a reference potential;
    a first MIS transistor circuit constituted by at least one MIS transistor, connected to a base and the collector of the first bipolar transistor and the first input terminal, and turned on or off in response to a potential supplied to the first input terminal;
    a second MIS transistor circuit constituted by at least one MIS transistor, connected to the base of the first bipolar transistor and a base of the second bipolar transistor, and turned on or off in response to a potential supplied to the second input terminal; and
    a first capacitor having one terminal connected to the first input terminal and the other terminal connected to the base of the second bipolar transistor.

2. The BiMIS logic circuit according to claim 1, further comprising a second output terminal connected to the base of the first bipolar transistor.

3. The BiMIS logic circuit according to claim 2, wherein when a plurality of BiMIS logic circuits are connected, the first output terminal of the BiMIS logic circuit in the upstream is connected to the first input terminal of the BiMIS logic circuit in the downstream, the second output terminal of the BiMIS logic circuit in the upstream is connected to the second input terminal of the BiMIS logic circuit in the downstream.

4. The BiMIS logic circuit according to claim 1, wherein the first MIS transistor circuit is constituted by a MIS transistor a drain of which is connected to the base of the first bipolar transistor, a gate of which is connected to the first input terminal and a source of which receives the first potential; and
    the second MIS transistor circuit is constituted by a MIS transistor a drain of which is connected to the base of the first bipolar transistor, a gate of which is connected the second input terminal, and a source of which is connected to the base of the second bipolar transistor.

5. The BiMIS logic circuit according to claim 1, wherein one of the first and second MIS transistor circuit is turned on when all the input signals are at a low level, and the other is turned on when at least one of the input signals is at a high level.

6. The BiMIS logic circuit according to claim 1, wherein one of the first and second MIS transistor circuits is constituted by a plurality of MIS transistors whose current paths are serially connected to each other, and the other is constituted by a plurality of MIS transistors whose current paths are connected in parallel to each other.

7. The BiMIS logic circuit according to claim 1, further comprising at least one of:

discharging means connected to the base of the first bipolar transistor for discharging the base; and potential setting means connected to the base of the second bipolar transistor for setting a potential of the base at a predetermined level.

8. A BiMIS logic circuit, comprising:

first and second input terminals;

a first output terminal;

a first bipolar transistor, a collector of which receives a first potential, and an emitter of which is connected to the first output terminal;

a second bipolar transistor, a collector of which is connected to the first output terminal and an emitter of which receives a reference potential;

a first MIS transistor circuit constituted by at least one MIS transistor, connected to the first input terminal and the collector and a base of the first bipolar transistor, and turned on or off in response to a potential supplied to the first input terminal;

a second MIS transistor circuit constituted by at least one MIS transistor, connected to the base of the first bipolar transistor, the second input terminal and a base of the second bipolar transistor, and turned on or off in response to a potential supplied to the second input terminal;

discharging means connected to the base of the first bipolar transistor for discharging the base; and a second output terminal connected to the base of the first bipolar transistor.

9. The BiMIS logic circuit according to claim 8, wherein when a plurality of BiMIS logic circuits are connected, the first output terminal of the BiMIS circuit in the upstream is connected to the first input terminal of the BiMIS logic circuit in the downstream, and the second output terminal of the BiMIS circuit in the upstream is connected to the second input terminal of the BiMIS logic circuit in the downstream.

10. A BiMIS logic circuit, comprising:

first and second input terminals;

a first output terminal;

a first bipolar transistor, a collector of which receives a first potential, and an emitter of which is connected to the first output terminal;

a second bipolar transistor, a collector of which is connected to the first output terminal and an emitter of which receives a reference potential;

a first MIS transistor circuit constituted by at least one MIS transistor, connected to the first input terminal and the collector and a base of the first bipolar transistor, and turned on or off in response to a potential supplied to the first input terminal;

a second MIS transistor circuit constituted by at least one MIS transistor, connected to the base of the first bipolar transistor, the second input terminal and a base of the second bipolar transistor, and turned on or off in response to a potential supplied to the second input terminal; and discharging means connected to the base of the first bipolar transistor for discharging the base; and wherein the first MIS transistor circuit is constituted by a MIS transistor, a drain of which is connected to the base of the first bipolar transistor, a gate of which is connected to the first input terminal, and a source of which receives the first potential; and the second MIS transistor circuit is constituted by a MIS transistor, a drain of which is connected to the base of the first bipolar transistor, a gate of which is connected to the second input terminal, and a source of which is connected to the base of the second bipolar transistor.

11. A BiMIS logic circuit, comprising:

first and second input terminals;

a first output terminal;

a first bipolar transistor, a collector of which receives a first potential, and an emitter of which is connected to the first output terminal;

a second bipolar transistor, a collector of which is connected to the first output terminal and an emitter of which receives a reference potential;

a first MIS transistor circuit constituted by at least one MIS transistor, connected to the first input terminal and the collector and a base of the first bipolar transistor, and turned on or off in response to a potential supplied to the first input terminal;

a second MIS transistor circuit constituted by at least one MIS transistor, connected to the base of the first bipolar transistor, the second input terminal and a base of the second bipolar transistor, and turned on or off in response to a potential supplied to the second input terminal; and discharging means connected to the base of the first bipolar transistor for discharging the base; and further comprising at least one of:

a capacitor, one terminal of which is connected to the first input terminal and the other terminal of which is connected to the base of the second bipolar transistor; and potential setting means connected to the base of the second bipolar transistor for setting a potential of the base at a predetermined level.

12. A BiMIS logic circuit, comprising:

first and second input terminals, a first output terminal;

a first bipolar transistor, a collector of which receives a first potential and an emitter of which is connected to the first output terminal;

a second bipolar transistor, a collector of which is connected to the output terminal and an emitter of which receives a reference potential;

a first MIS transistor circuit constituted by at least one MIS transistor, connected to the first input terminal and the collector and the base of the first bipolar transistor, and turned on or off depending on a level of a potential supplied to the first input terminal;

a second MIS transistor circuit constituted by at least one MIS transistor, connected to the base of the first bipolar transistor and the second input terminal and the base of the second bipolar transistor, and turned on or off depending on a level of a potential supplied to the second input terminal;

potential setting means connected to the base of the second bipolar transistor, for setting a potential of the base at a predetermined level, and a second output terminal connected to the base of the first bipolar transistor.

13. A BiMIS logic circuit, comprising:

first and second input terminals, a first output terminal;

a first bipolar transistor a collector of which receives a first potential and an emitter of which is connected to the first output terminal;

a second bipolar transistor a collector of which is connected to the output terminal and an emitter of which receives a reference potential;

a first MIS transistor circuit constituted by at least one MIS transistor, connected to the first input terminal and the collector and the base of the first bipolar transistor, and turned on or off depending on a level of a potential supplied to the first input terminal;

a second MIS transistor circuit constituted by at least one MIS transistor, connected to the base of the first bipolar transistor and the second input terminal and the base of the second bipolar transistor, and turned on or off depending on a level of a potential supplied to the second input terminal; and potential setting means connected to the base of the second bipolar transistor, for setting a potential of the base at a predetermined level; and wherein when a plurality of BiMIS logic circuits are connected, the first output terminal of the BiMIS logic circuit in the upstream is connected to the first input terminal of the BiMIS logic circuit in the downstream and the second output terminal of the BiMIS logic circuit in the upstream is connected to the second input terminal of the BiMIS logic circuit in the downstream.

14. A BiMIS logic circuit comprising:

first and second input terminals, a first output terminal;

a first bipolar transistor a collector of which receives a first potential and an emitter of which is connected to the first output terminal;

a second bipolar transistor a collector of which is connected to the output terminal and an emitter of which receives a reference potential;

a first MIS transistor circuit constituted by at least one MIS transistor, connected to the first input terminal and the collector and the base of the first bipolar transistor, and turned on or off depending on a level of a potential supplied to the first input terminal;

a second MIS transistor circuit constituted by at least one MIS transistor, connected to the base of the first bipolar transistor and the second input terminal and the base of the second bipolar transistor, and turned on or off depending on a level of a potential supplied to the second input terminal; and potential setting means connected to the base of the second bipolar transistor, for setting a potential of the base at a predetermined level; and wherein the first MIS transistor circuit is constituted by an MIS transistor, a drain of which is connected to the base of the first bipolar transistor, a gate of which is connected to the first input terminal, and a source of which receives a first potential; and the second MIS transistor circuit is constituted by an MIS transistor, a drain of which is connected to the base of the first bipolar transistor, a gate of which is connected to the second input terminal, and a source of which is connected to the base of the second bipolar transistor.

15. A BiMIS logic circuit, comprising:

first and second input terminals, a first output terminal;

a first bipolar transistor a collector of which receives a first potential and an emitter of which is connected to the first output terminal;

a second bipolar transistor a collector of which is connected to the output terminal and an emitter of which receives a reference potential;

a first MIS transistor circuit constituted by at least one MIS transistor, connected to the first input terminal and the collector and the base of the first bipolar transistor, and turned on or off depending on a level of a potential supplied to the first input terminal;

a second MIS transistor circuit constituted by at least one MIS transistor, connected to the base of the first bipolar transistor and the second input terminal and the base of the second bipolar transistor, and turned on or off depending on a level of a potential supplied to the second input terminal; and potential setting means connected to the base of the second bipolar transistor, for setting a potential of the base at a predetermined level; and further comprising at least one of:

a capacitor, one terminal of which is connected to the first input terminal and the other terminal of which is connected to the base of the second bipolar transistor; and discharging means connected to the base of the first bipolar transistor for discharging the base.

* * * * *